United States Patent [19]
Okamoto et al.

[11] Patent Number: 5,892,702
[45] Date of Patent: Apr. 6, 1999

[54] SEMICONDUCTOR MEMORY DEVICE AND METHOD OF MANUFACTURING THE SAME

[75] Inventors: Tatsuo Okamoto; Atsushi Hachisuka; Hideaki Arima; Mitsuya Kinoshita, all of Hyogo, Japan

[73] Assignee: Mitsubishi Denki Kabushiki Kaisha, Tokyo, Japan

[21] Appl. No.: 710,901

[22] Filed: Sep. 24, 1996

Related U.S. Application Data

[63] Continuation of Ser. No. 253,435, Jun. 6, 1994, abandoned.

[30] Foreign Application Priority Data

| Jul. 7, 1993 | [JP] | Japan | 5-168090 |
| Nov. 12, 1993 | [JP] | Japan | 5-283346 |

[51] Int. Cl.$^6$ ................................ G11C 11/24
[52] U.S. Cl. ............................. 365/149; 257/308
[58] Field of Search ................ 365/149; 257/308, 257/309

[56] References Cited

U.S. PATENT DOCUMENTS

| 5,037,773 | 8/1991 | Lee et al. | 437/60 |
| 5,110,752 | 5/1992 | Lu | 437/47 |
| 5,164,337 | 11/1992 | Ogawa et al. | 437/228 |
| 5,182,232 | 1/1993 | Chhabra et al. | 437/200 |
| 5,227,651 | 7/1993 | Kim et al. | 257/309 |
| 5,304,828 | 4/1994 | Kim et al. | 257/309 |
| 5,475,248 | 12/1995 | Takenaka | 257/295 |
| 5,491,356 | 2/1996 | Oennison et al. | 257/309 |

FOREIGN PATENT DOCUMENTS

| 41 36 420 | 5/1992 | Germany . | |
| 42 29 837 | 3/1993 | Germany . | |
| 59-61063 | 4/1984 | Japan | 257/309 |
| 2-89869 | 3/1990 | Japan . | |
| 3-252162 | 11/1991 | Japan . | |
| 3-263370 | 11/1991 | Japan . | |
| 3-266460 | 11/1991 | Japan | 257/309 |
| 4-320370 | 11/1992 | Japan . | |
| 4-368172 | 12/1992 | Japan | 257/309 |
| 5-6974 | 1/1993 | Japan . | |
| 5-36925 | 2/1993 | Japan | 257/309 |

OTHER PUBLICATIONS

Solid State Technology, Jul., 1992, "Hemispherical Grain Silicon for High Density DRAMs".
A New Cylindrical Capacitor Using Hemispherical Grained SI (HSG–SI) For 256MB DRAMS, H. Watanabe et al., IEEE Team Tech. Dig. 1992, pp. 10.1.1–10.1.4.
A New Stacked Capacitor Structure Using Hemispherical–Grain (HSG) Poly–Silicon Electrodes, H. Watanabe et al., Extended Abstracts of the 22nd Conference on Solid State Devices and Materials, Sendai 1990, pp. 873–876.
High Temperature Process Limitation on TISI$_2$, C.Y. Ting et al., J. Electrochem. Soc., Solid–State Science and Technology, Dec. 1986, pp. 2621–2625.

*Primary Examiner*—A. Zarabian
*Attorney, Agent, or Firm*—McDermott, Will & Emery

[57] ABSTRACT

In a semiconductor memory device having cylindrical capacitors, word lines and a bit line are formed on a semiconductor substrate. A cylindrical storage node is connected to a conductive layer. The cylindrical storage node is provided at its inner wall with protruded conductive conductors which protrudes in a radially inward direction of the cylindrical storage node. A surface of the cylindrical storage node is covered with a capacitor insulating film. The outer surface of the cylindrical storage node is covered with a cell plate with the capacitor insulating film therebetween.

5 Claims, 43 Drawing Sheets

SEMICONDUCTOR MEMORY DEVICE AND METHOD OF MANUFACTURING THE SAME

This application is a continuation of application Ser. No. 08/253,435, filed Jun. 6, 1994, now abandoned.

BACKGROUND OF THE INVENTION

1. Field of the Invention

The present invention relates in general to a semiconductor memory device, and in particular, to an improvement of a semiconductor memory device in which a sufficient capacitor capacity can be ensured even if degree of integration is increased. The present invention also relates to a method of manufacturing such a semiconductor memory device.

2. Description of the Related Art

In recent years, demands for semiconductor memory devices have been rapidly increased owing to remarkable spread of information equipments such as computers. In connection with function, such devices have been demanded that have a large scale storage capacity and can operate at a high speed. In compliance with these demands, technologies have been developed for improving degree of integration, response and reliability of the semiconductor memory devices.

Dynamic random access memories (DRAMs) have been known as a kind of semiconductor memory devices which enable random input and output of storage information. In general, the DRAM is formed of a memory cell array, which is a storage region storing a large number of storage information, and a peripheral circuitry required for external input and output.

FIG. 1 is a block diagram showing a structure of a conventional DRAM. In FIG. 1, a DRAM 1 includes a memory cell array 2 which stores data signals of stored information, a row and column address buffer 3 which externally receives an address signal for selecting a memory cell merely forming a storage circuit, a row decoder 4 and a column decoder 5 which decode the address signal to designate the memory cell, a sense refresh amplifier 6 which amplifies and reads the signal stored in the designated memory cell, data-in buffer 7 and a data-out buffer 8 for data input and output, and a clock generator 9 generating a clock signal. The memory cell array 2 which occupies a large area on the semiconductor chip is provided with a plurality of memory cells, which function merely to store the information and are disposed in a matrix form.

FIG. 2 is an equivalent circuit diagram showing memory cells for four bits forming the memory cell array. Each memory cell in the figure is formed of one MOS transistor and one capacitor connected thereto, and thus is of so-called an one-transistor/one-capacitor type. Since the memory cells of this type have a simple structure, the degree of integration of the memory cell array can be increased easily, and they have been widely used in DRAMs of a large capacity.

The memory cell of the DRAM can be classified into several types based on the structure of the capacitor.

FIG. 3 is a cross section of a memory cell having a typical stacked type capacitor in the prior art. Referring to FIG. 3, the memory cell includes one transfer gate transistor and one stacked type capacitor. The transfer transistor includes a pair of source/drain regions 11 formed at a surface of a silicon substrate 10, and gate electrodes (word lines) 12 formed on the surface of the silicon substrate 10 with an insulating layer therebetween. The stacked type capacitor is formed of a lower electrode (storage node) 14, which is extended over the gate electrode 12 and a field isolating film 13, and is connected to one of the source/drain regions 11, a dielectric layer 15 formed on the surface of the lower electrode 14, and an upper electrode (cell plate) 16 formed on the surface of the dielectric layer 15. The upper electrode 16 is covered with an interlayer insulating film 19 disposed on the silicon substrate 10. In the interlayer insulating film 19, there is provided a contact hole 18 through which the surface of the other source/drain region of the transfer gate transistor is exposed. A bit line 17 is connected to the other source/drain region 11 of the transfer gate transistor through the contact hole 18.

FIG. 4 is a plan showing a semiconductor memory device having a cylindrical capacitor, which belongs to another type of DRAM and is disclosed in Japanese Patent Laying-Open No. 02-89869 (1990). FIG. 5 is a cross section taken along line V—V in FIG. 4.

Referring to these figures, a plurality of word lines 12a, 12b, 12c, 12d and 12e are formed on the surface of the silicon substrate 10. Bit lines 21 extend perpendicularly to the word lines 12a, 12b, 12c, 12d and 12e. Memory cells are provided near crossings of the word lines and bit lines.

Each memory cell is formed of one transfer gate transistor 22 and one capacitor 23. The transfer gate transistor 22 includes a pair of source/drain regions 11 formed at the surface of the silicon substrate 10, and the gate electrodes (word lines 12a and 12b) formed on the surface of the silicon substrate 10. The word lines 12a, 12b, 12c and 12d are covered with an insulating layer 24 provided on the silicon substrate 10. In the insulating layer 24, there is provided a contact hole 25 through which one of the source/drain regions 11 is exposed.

Through the contact hole 25, a storage node 26 is connected to one of the source/drain regions 11. The storage node 26 includes a bottom conductive portion 27 and a side wall conductive portion 28. The bottom conductive portion 27 is in contact with one of the source/drain regions 11 through the contact hole 25 and extends along the surface of the insulating layer 24. The side wall conductive portion 28 is continuous with the outer periphery of the bottom conductive portion 27 and extends upwardly therefrom.

The surface of the storage node 26 is covered with a capacitor insulating film 29, and is further covered with a cell plate 30 with the capacitor insulating film 29 therebetween. The cell plate 30 is covered with an interlayer insulating film 31 provided on the silicon substrate 10. On the interlayer insulating film 31, there are provided interconnection layers 32, which are covered with a protection film 33 provided on the silicon substrate 10.

In the cylindrical capacitor having the aforementioned structure, since the storage node 26 has the side wall conductive portion 28 of which surface contributes to the capacitor capacity, the overall capacity of the capacitor is large.

A method of manufacturing the semiconductor memory device shown in FIG. 5 will be described below.

FIGS. 6–20 are fragmentary cross sections of the semiconductor memory device at a series of steps in a process of manufacturing the semiconductor memory device shown in FIG. 5.

Referring to FIG. 6, a field oxide film 13 is formed on the main surface of the silicon substrate 10 by the LOCOS method.

Referring to FIG. 7, a gate insulating film 34 is formed on the surface of the silicon substrate 10, and then, the word lines 12a, 12b, 12c and 12d made of polysilicon are formed thereon. The insulating layers 24 are formed to cover the word lines 12a, 12b, 12c and 12d. Using the word lines 12a, 12b, 12c and 12d covered with the insulating layers 24 as a mask, impurity ions are implanted into the surface of the silicon substrate 10 to form the source/drain regions 11.

Referring to FIG. 8, a layer of metal such as tungsten, molybdenum or titanium having a high melting point is deposited on the surface of the silicon substrate 10 for forming the bit line 17, and is patterned into a predetermined configuration. The layer thus patterned forms the bit line 17 which is in direct contact with one of the source/drain regions 11 of the transfer gate transistor. An insulating layer 35 is formed to cover the surface of the bit line 17.

Referring to FIG. 9, a first polysilicon layer 36 containing impurity introduced thereinto is deposited on the surface of the silicon substrate 10 by the CVD method.

Referring to FIG. 10, an insulating layer 37 made of a silicon oxide film is deposited on the surface of the silicon substrate 10.

Referring to FIG. 11, resist patterns 38 of a predetermined configuration are formed on the surface of the insulating layer 37. As will be seen later, a width w of the resist pattern 38 determines a distance between adjoining capacitors.

Referring to FIG. 12, the insulating layer 37 is selectively etched using the resist patterns 38 as a mask.

Referring to FIGS. 12 and 13, the resist patterns 38 are removed, and then a second polysilicon layer 39 containing impurity introduced thereinto is deposited on the whole surface of the silicon substrate 10 by the CVD method so that the second polysilicon layer 39 covers the side walls and upper end surfaces of the patterned insulating layers 37.

Referring to FIG. 14, a resist 40 is applied to the surface of the silicon substrate 10 so that the resist 40 fully covers the uppermost surfaces of the second polysilicon layer 39.

Referring to FIGS. 14 and 15, the resist 40 is etched back to expose the upper end surfaces of the second polysilicon layer 39.

Referring to FIGS. 15 and 16, the exposed upper end surfaces of the second polysilicon layer 39 are etched. Thereafter, the insulating layers 37 are removed by etching, e.g., with HF liquid.

Referring to FIGS. 16 and 17, anisotropic etching is effected to remove exposed portions 36a of the first polysilicon layer 36 in a self-aligning manner. Thereafter, the resist 40 is removed. Through these steps, the bottom conductive portion 27 and side wall conductive portion 28 of the storage node 26 are formed.

Referring to FIG. 18, the capacitor insulating film 29 made of, e.g., silicon nitride, silicon oxide, tantalum pentaoxide or hafnium oxide is formed on the surface of the storage node 26.

Referring to FIG. 19, the cell plate 30 is formed to cover the outer surface of the storage node 26 with the capacitor insulating film 29 therebetween. The cell plate 30 is made of material such as polysilicon containing impurity introduced thereinto.

Referring to FIG. 20, the interlayer insulating film 31 is formed on the whole surface of the silicon substrate 10 to cover the cell plate 30. The interconnection layers 32 having a predetermined configuration are formed on the interlayer insulating film 31. The protection film 33 covering the interconnection layers 32 is formed on the whole surface of the silicon substrate 10. Through the aforementioned steps, the semiconductor memory device shown in FIG. 5 is completed.

The semiconductor memory device having the cylindrical capacitors have the structure described above and is manufactured by the aforementioned method.

Meanwhile, such a method was recently proposed that, in order to increase the capacitor capacity, projections formed of silicon particles are provided at the surface of the cylindrical storage node so as to increase the surface area of the capacitor (IEDM, Technical Digest, 1992, pp 259–263).

FIG. 21 is a cross section of a semiconductor memory device having a cylindrical capacitor which is manufactured by the method proposed in the above reference.

The prior art shown in FIG. 21 differs from the prior art shown in FIG. 20 in that silicon particles 41 are provided on the outer surface of the storage node 26, the capacitor insulating film 29 is provided on the outer surface of the storage node 26 including the surfaces of the silicon particles 41, and the cell plate 30 is provided on the capacitor insulating film 29.

The semiconductor memory device shown in FIG. 21 is obtained only by an ideal manufacturing process, and has such a problem that a practical manufacturing process cannot produce the silicon particles 41 having a uniform diameter shown in the figure.

This problem will be described below with reference to the drawings.

FIG. 22 is a fragmentary cross section of the semiconductor memory device at a major step in the process of manufacturing the semiconductor memory device shown in FIG. 21.

The step shown in FIG. 22 is carried out between the steps shown in FIGS. 17 and 18.

The silicon particles 41 are formed on the side wall of the storage node 26 in the following manner.

The silicon substrate 10 provided with the storage node 26 is introduced into a pressure-reduced CVD chamber. A temperature of 600° C. and a high vacuum state of not more than $1 \times 10^{-7}$ Torr are maintained in the CVD chamber. Under there conditions, $Si_2H_6$ gas or the like is flowed through the CVD chamber for ten seconds, so that minute cores of the silicon particles 41 of nearly hemispheric shapes are formed on the surfaces of the bottom conductive portion 27 and side wall conductive portion 28 of the storage node 26.

Referring to FIG. 22, the silicon particle generally has a size of 500 to 1000 Å. However, if the surface state of the storage node 26 is uneven or the process condition is not uniform, the density and sizes of the silicon particles 41 fluctuate.

The uneven surface state of the storage node 26 may be caused, for example, if amorphous silicon at the surface of the storage node 26 is partially crystallized, if residue of resist and/or etching residue are present on the surface of the storage node, and if a natural oxide film is formed on the surface of the storage node. The nonuniform process condition may be caused, for example, by variation of the temperature and/or reduction of the vacuum in the CVD process.

If the sizes of the silicon particles 41 are uneven, a following problem is caused if a space between adjoining storage nodes is small in accordance with high density and high degree of integration of elements.

Referring to FIG. 23, the adjoining storage nodes 26, which are spaced by a short distance from each other, may be short-circuited via the silicon particles 41, resulting in bit error.

Even in the case where the short-circuit does not occur, the space between the adjoining storage nodes 26 is reduced by a distance corresponding to the thicknesses of the huge silicon particles 41, so that the capacitor insulating film 29 and cell plate 30 may not completely cover the outer surfaces of the storage nodes 26. This results in reduction of the memory cell characteristics.

SUMMARY OF THE INVENTION

The present invention has been developed to overcome the above problems, and has an object to obtain a semiconductor memory device of a large capacitor capacity.

Another object of the invention is to provide a semiconductor memory device having cylindrical capacitors and capable of preventing short-circuit between adjoining storage nodes.

Still another object of the invention is to provide a method of manufacturing a semiconductor memory device having such cylindrical capacitors.

According to an aspect of the invention, a semiconductor memory device includes a semiconductor substrate which is provided at its main surface with a conductive layer. A word line and a bit line are formed on the semiconductor substrate. The word line and the bit line are covered with an insulating film formed on the semiconductor substrate. The insulating film is provided with a contact hole for partially exposing the conductive layer. A cylindrical storage node is electrically connected to the conductive layer. The cylindrical storage node includes a bottom conductive portion which is in contact with the conductive layer through the contact hole and is disposed along a surface of the insulating film, and a side wall conductive portion which is continuous with and extends upwardly from an outer periphery of the bottom conductive portion. The cylindrical storage node formed of the bottom conductive portion and the side wall conductive portion has an inner wall provided with a protruded conductor which protrudes in a radially inward direction of the cylindrical storage node. The semiconductor memory device further includes a capacitor insulating film which covers a whole outer surface of the cylindrical storage node including an outer surface of the protruded conductor. There is also provided a cell plate covering the outer surface of the cylindrical storage node with the capacitor insulating film therebetween.

According to a second aspect of the invention, a semiconductor memory device includes a semiconductor substrate and a storage node provided on the semiconductor substrate. The storage node is provided at its outer surface with a concave portion hollowed inwardly from the outer surface. The semiconductor memory device further includes a capacitor insulating film which covers the whole outer surface of the storage node including a surface of the concave portion. There is also provided a cell plate covering the outer surface of the storage node with the capacitor insulating film therebetween.

A third aspect of the invention provides a method of manufacturing a semiconductor memory device which includes a plurality of cylindrical capacitors adjoining each other. In the method, a word line is first formed on a semiconductor substrate. Source/drain regions are formed on a main surface of the semiconductor substrate with the word line between each other. A bit line connected to one of the source/drain regions is formed on the semiconductor substrate. A cylindrical storage node is formed on the semiconductor substrate. The cylindrical storage node includes a bottom conductive portion, which is connected to the other of the source/drain regions and spreads up to a position above the word line with the insulating layer therebetween, and a side wall conductive portion, which is continuously extends upwardly from an outer periphery of the bottom conductive portion and has inner and outer walls. Protruded conductors are selectively formed only on the bottom conductive portion and the inner wall of the side wall conductive portion of the cylindrical storage node. A capacitor insulating film is formed to cover the whole outer surface of the cylindrical storage node including outer surfaces of the protruded conductors. A cell plate is formed to cover the outer surface of the cylindrical storage node with the capacitor insulating film therebetween.

A fourth aspect of the invention provides a method of manufacturing a semiconductor memory device which includes a plurality of cylindrical capacitors adjoining each other. In the method, a word line is formed on a semiconductor substrate. Source/drain regions are formed on a main surface of the semiconductor substrate with the word line between each other. A bit line connected to one of the source/drain regions is formed on the semiconductor substrate. A first conductive film, which is connected to the other of the source/drain regions and covers the word line and the bit line, is formed on the whole upper surface of the semiconductor substrate with an insulating layer therebetween. A pattern of an insulating member, which extends upwardly and has an upper end surface and a side wall, is formed at a region on the first conductive film except for a region on which the cylindrical capacitor is formed. A second conductive film is formed on the whole upper surface of the first conductive film to cover the upper end surface and the side wall of the pattern of the insulating member. Protruded conductors are formed on the whole surface of the second conductive film. A portion of the second conductive film located above the upper end surface of the pattern of the insulating member is selectively removed by etching to expose the upper end surface of the insulating member. A portion of the pattern of the insulating member starting from the exposed upper end surface is removed by etching to form a cylindrical storage node, which includes a bottom conductive portion bearing the protruded conductors, and a side wall conductive portion continuously extending upwardly from an outer periphery of the bottom conductive portion and being provided at its inner wall with the protruded conductors. A capacitor insulating film is formed to cover a whole outer surface of the cylindrical storage node including surfaces of the protruded conductors. A cell plate is formed to cover the outer surface of the cylindrical storage node with the capacitor insulating film therebetween.

A fifth aspect of the invention provides a method of manufacturing a semiconductor memory device in which a storage node made of silicon is first formed on a semiconductor substrate. A metal film is formed to cover a surface of the storage node. The storage node covered with the metal film is heated to form a silicide film on the surface of the storage node. The silicide film is condensed. The condensed silicide film is removed from the surface of the storage node. A capacitor insulating film is formed to cover the surface of the storage node. A cell plate is formed to cover the outer surface of the storage node with the capacitor insulating film therebetween.

According to the semiconductor memory device having the cylindrical capacitor of the first aspect of the invention, since the cylindrical storage node is provided at its inner wall with the protruded conductors which increases a surface area, a capacitor capacity is increased. Since the protruded conductor is not provided at an outer wall of the cylindrical storage node, short-circuit between the adjoining storage nodes is prevented.

Since the protruded conductor is not provided at the outer wall of the cylindrical storage node, the cell plate covers well the surface of the storage node.

According to the semiconductor memory device of the second aspect of the invention, the storage node is provided at its outer surface with concave portions hollowed inwardly from the outer surface, so that an area of the outer surface of the storage node increases, and thus a capacitor capacity increases.

The methods of manufacturing the semiconductor memory device according to the third and fourth aspects, since the protruded conductors are formed at only the inner wall of the cylindrical storage node, the semiconductor memory device can prevents short-circuit between the cylindrical storage node and an adjacent cylindrical storage node adjoining to the same, and has a large capacitor capacity.

According to the method of manufacturing the semiconductor memory device of the fifth aspect of the invention, the storage node covered with the metal film is heated to from the silicide film on the surface of the storage node. Thereafter, the silicide film is condensed, and then, the condensed silicide film is removed from the surface of the storage node. Thereby, the concave portions hollowed inwardly from the surface of the storage node are formed at the surface of the storage node, so that the storage node has a large surface area.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Embodiments of the invention will be described below with reference to the drawings.

Figure 1:
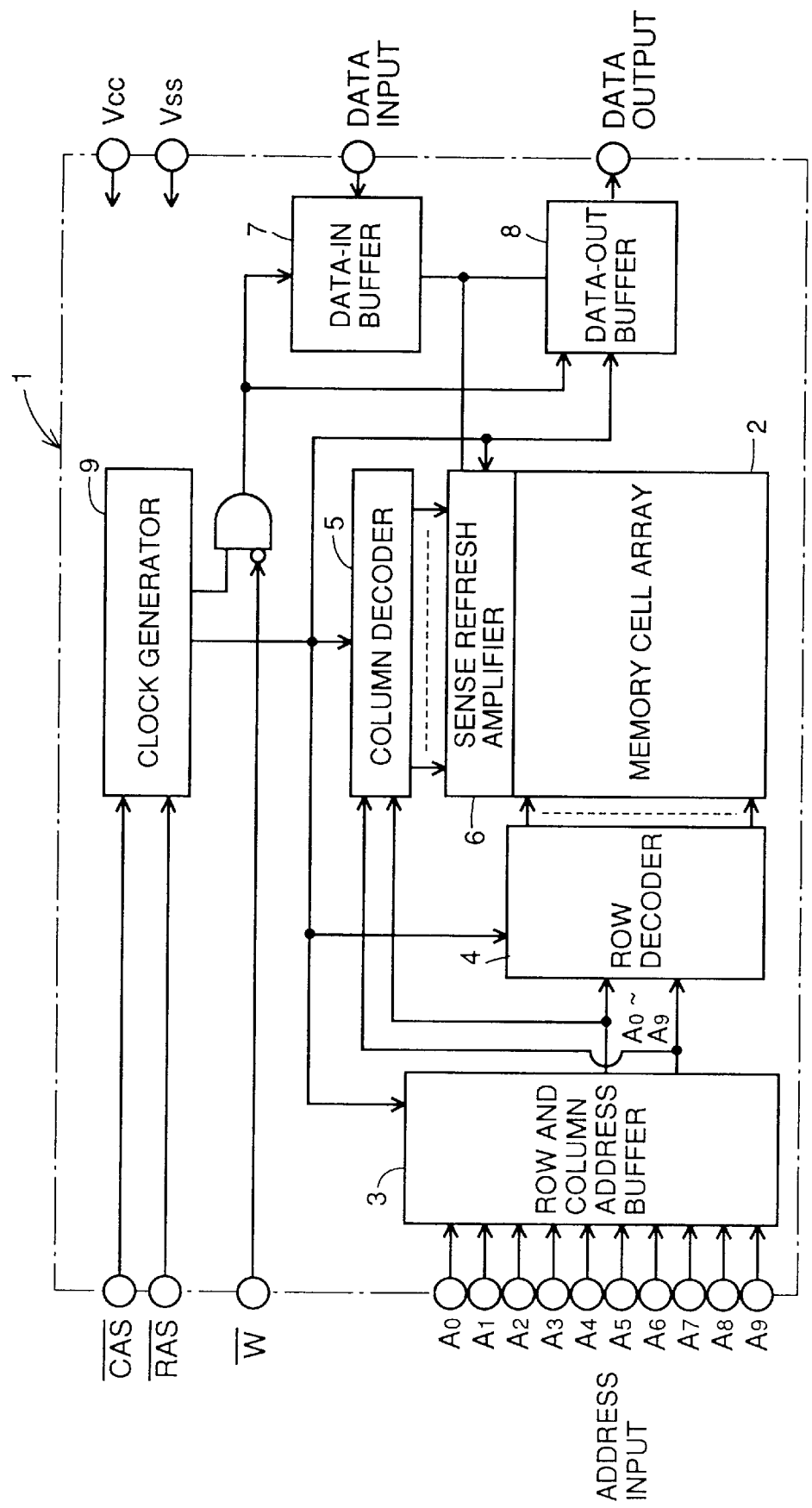
FIG. 1 is a block diagram of a conventional DRAM.
Figure 2:
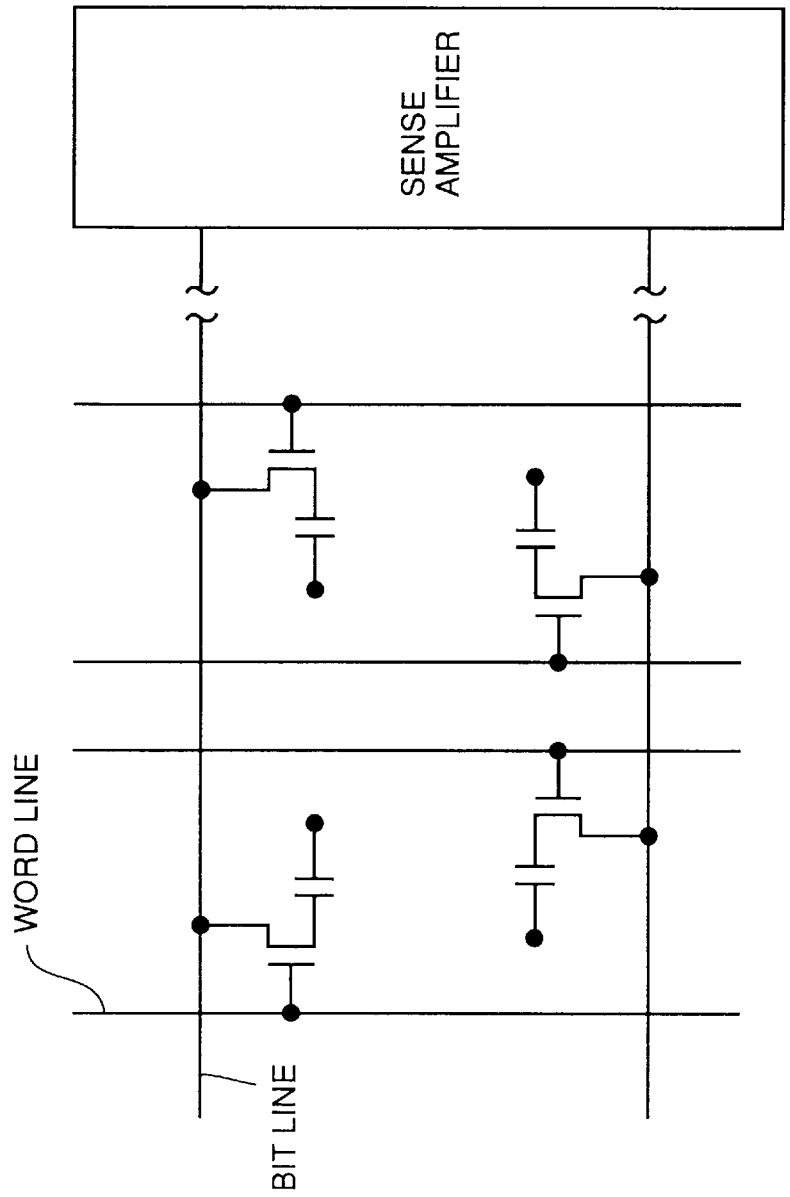
FIG. 2 is an equivalent circuit diagram of memory cells in the conventional DRAM.
Figure 3:
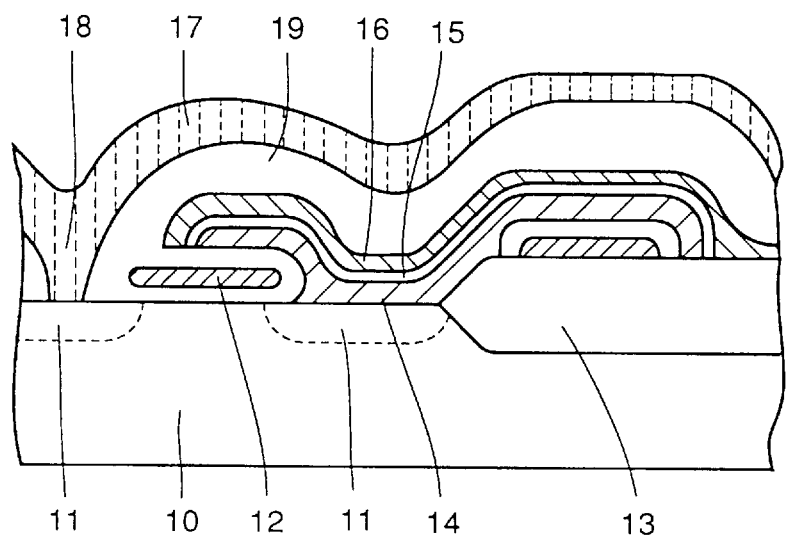
FIG. 3 is a cross section of a conventional DRAM memory cell with a stacked type capacitor.
Figure 4:
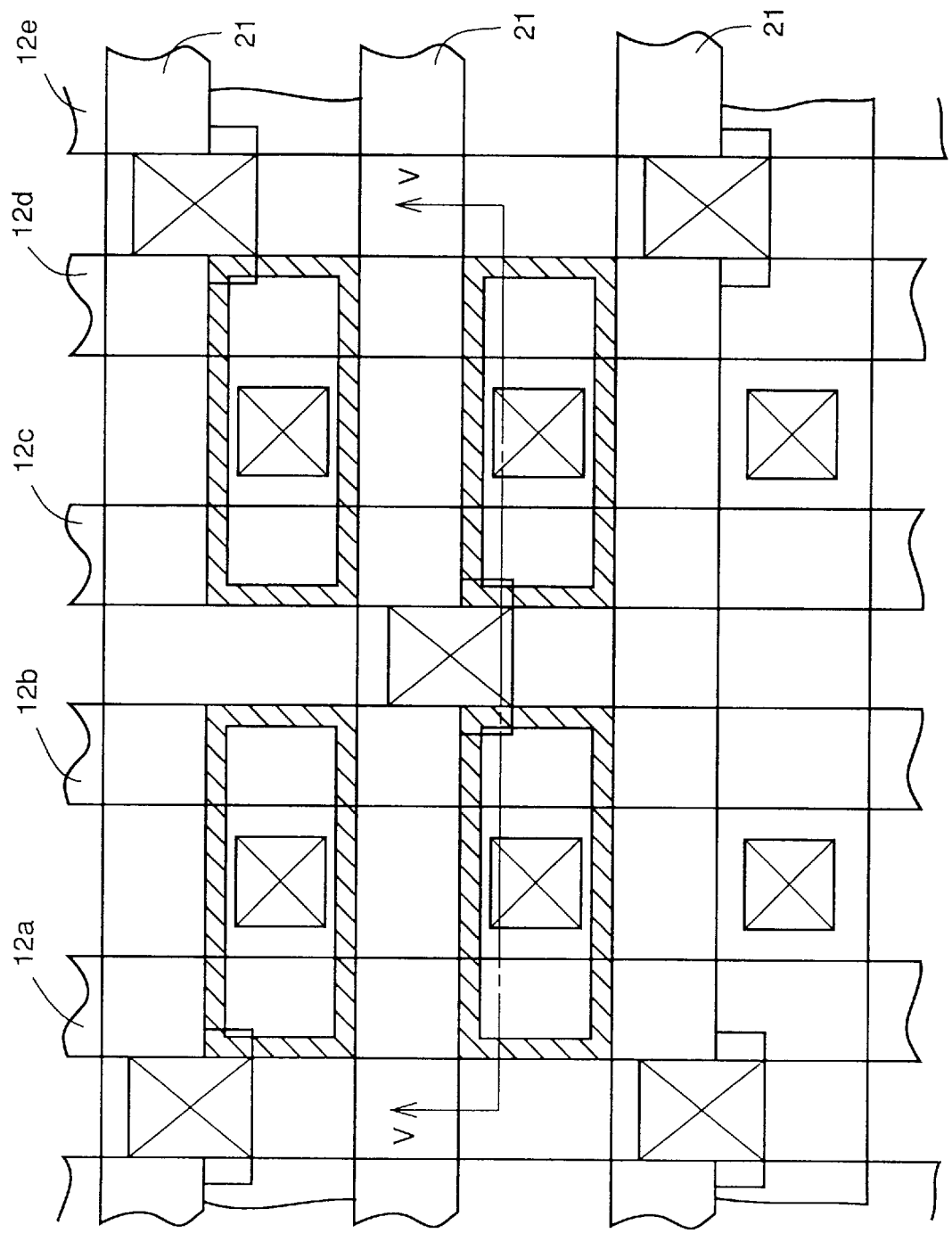
FIG. 4 is a plan of a memory array in an art relevant to the invention.
Figure 24:
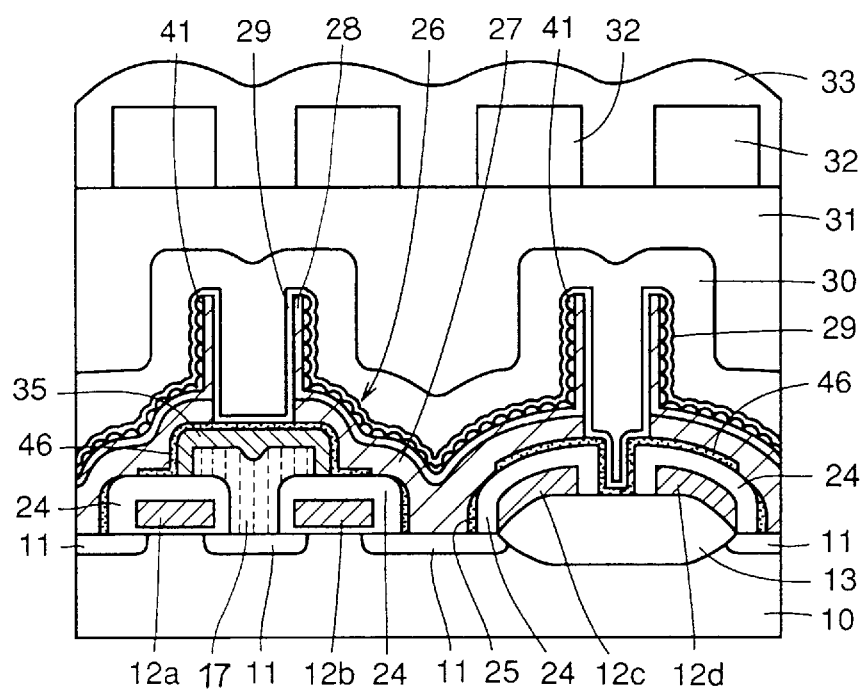
FIG. 24 is a cross section of a semiconductor memory device of an embodiment of the invention taken along a line parallel to a bit line.
Figure 25:
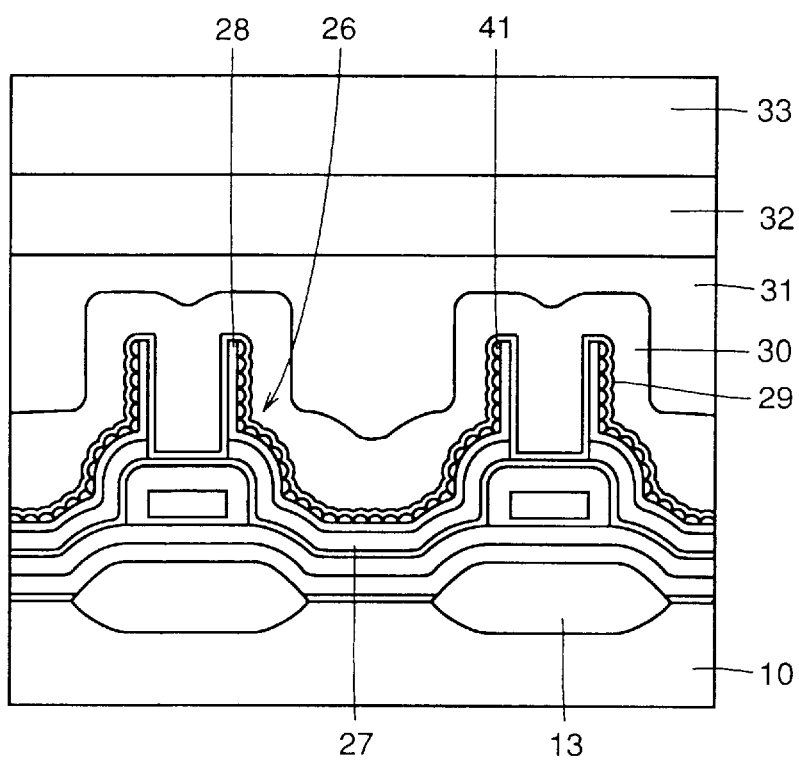
FIG. 25 is a cross section of the semiconductor memory device of the embodiment of the invention taken along a line parallel to a word line.

FIG. 24 is a cross section of a semiconductor memory device of an embodiment of the invention taken along line parallel to a bit line. FIG. 25 is a cross section of the semiconductor memory device of the embodiment of the invention taken along line parallel to a word line. The semiconductor memory device of the embodiment of the invention can be represented by the same plan as FIG. 4.

Figure 5:
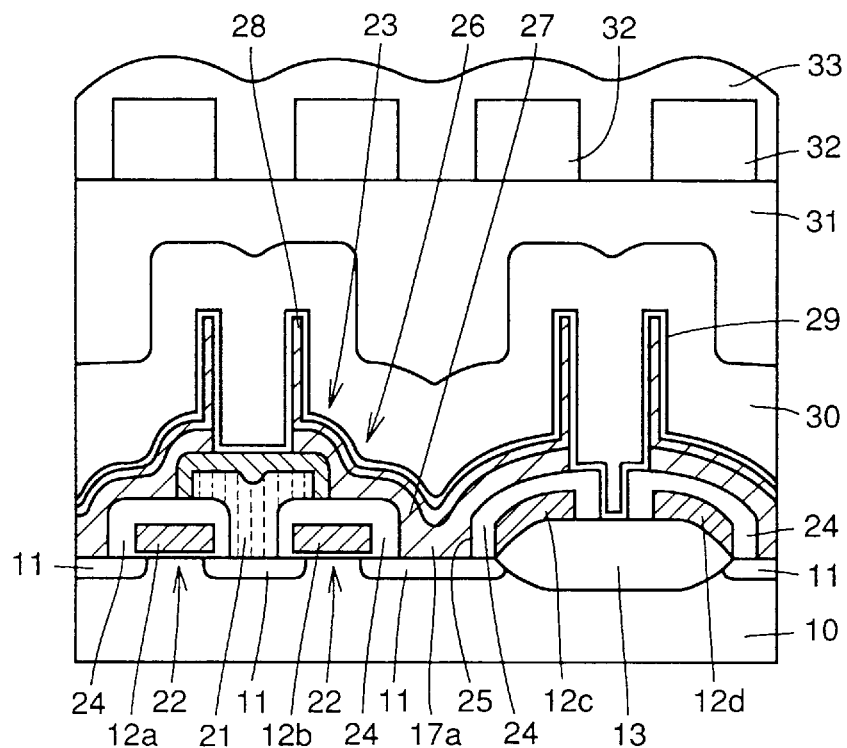
FIG. 5 is a cross section taken along line V—V in FIG. 4.
Figure 6:
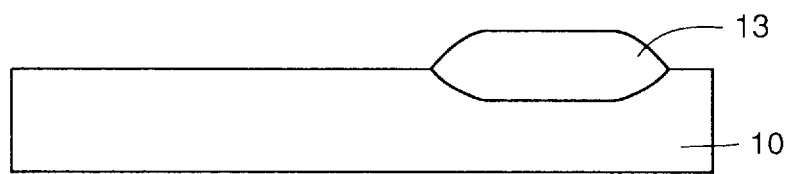
FIGS. 6–20 are fragmentary cross sections of the semiconductor memory device at 1st–21st steps in a process of manufacturing the semiconductor memory device shown in FIG. 5, respectively.
Figure 7:
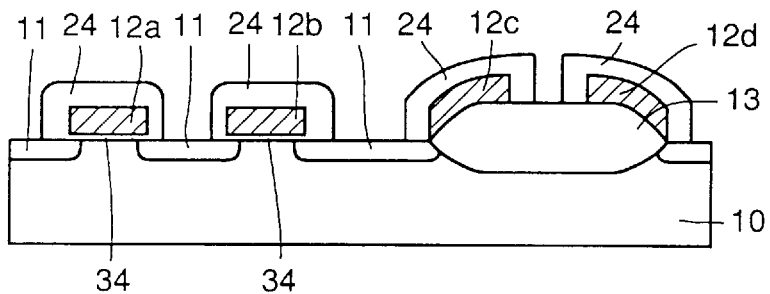
Figure 8:
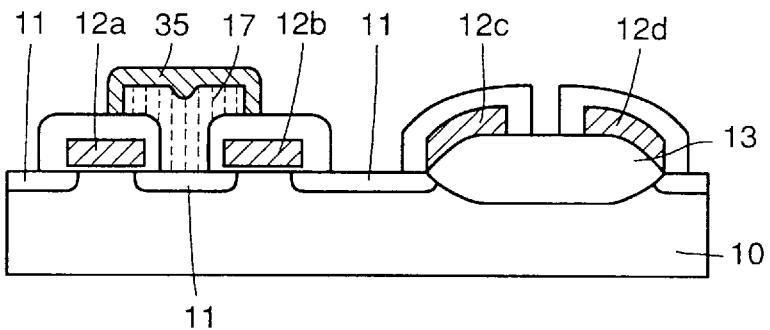
Figure 9:
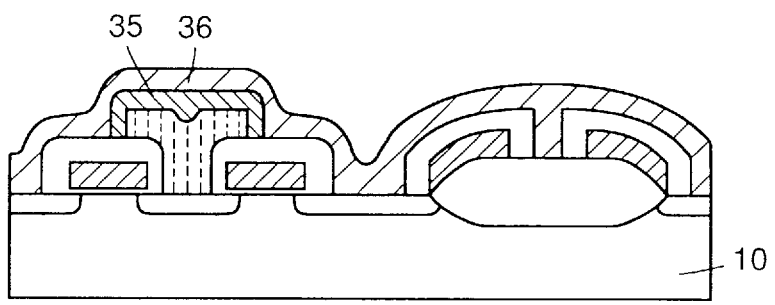
Figure 10:
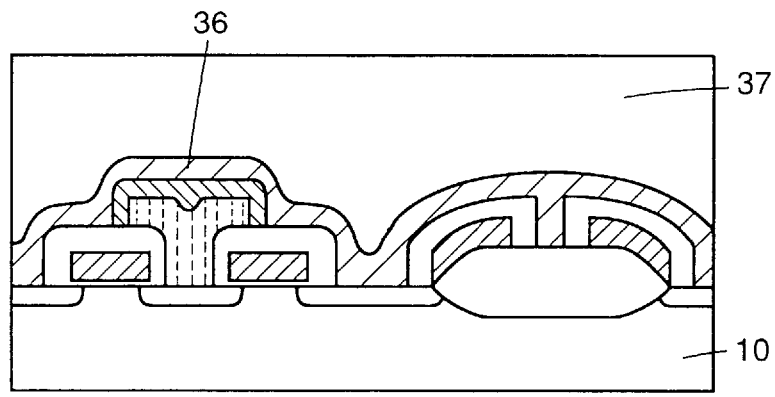
Figure 11:
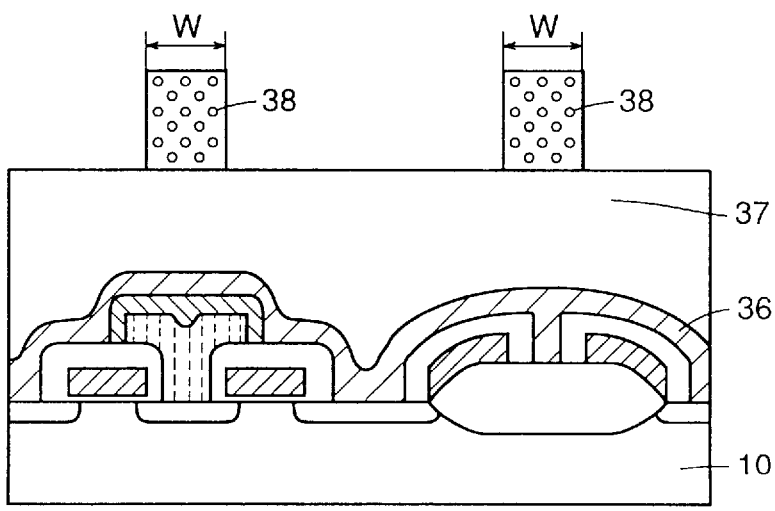
Figure 12:
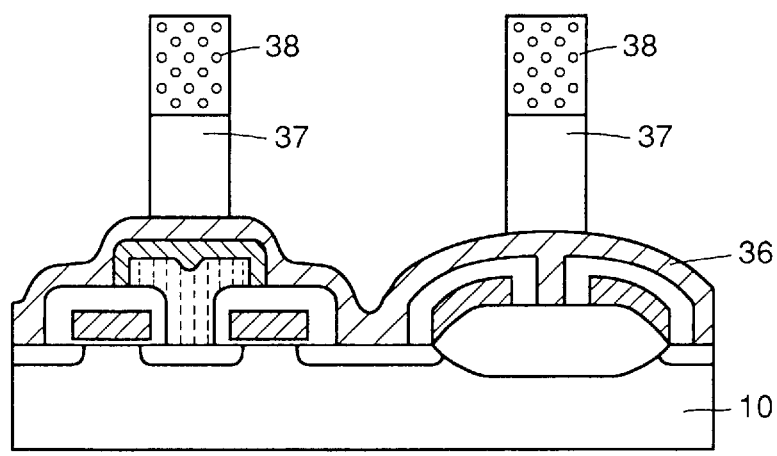
Figure 13:
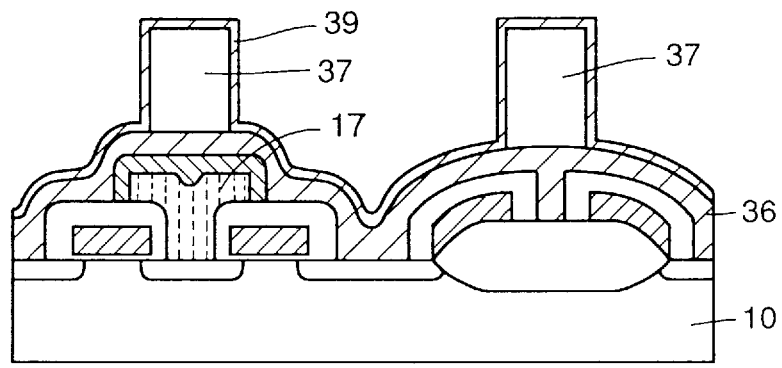
Figure 14:
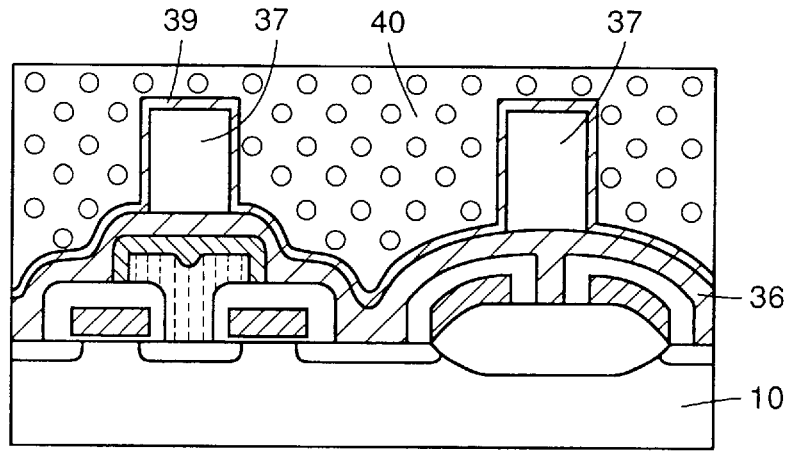
Figure 15:
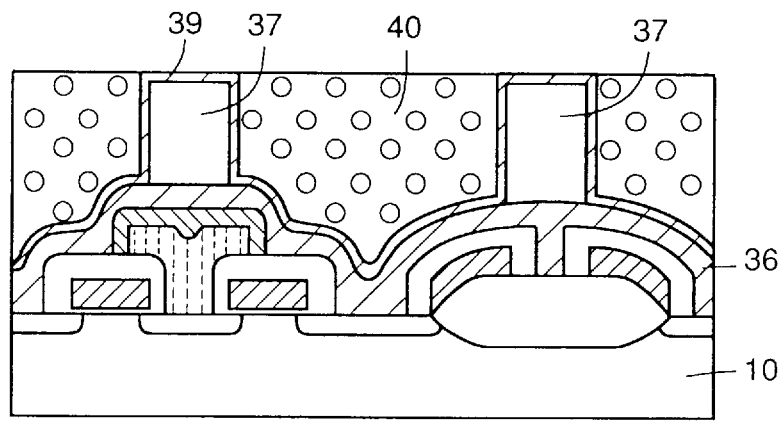
Figure 16:
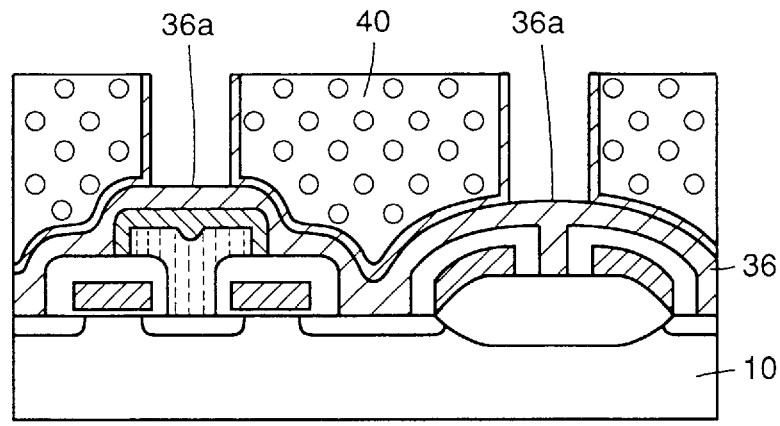
Figure 17:
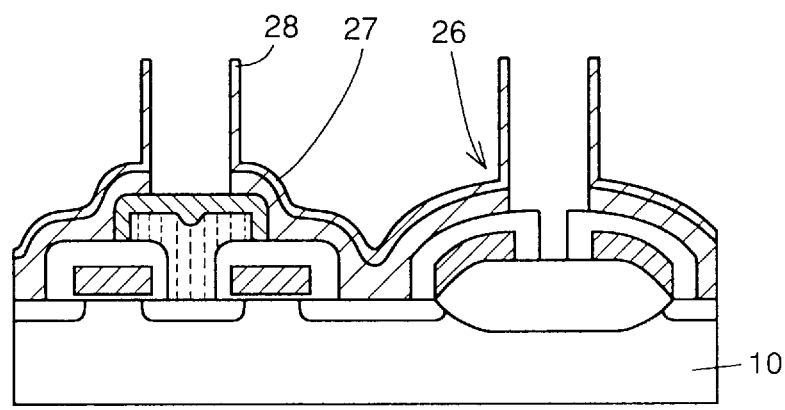
Figure 18:
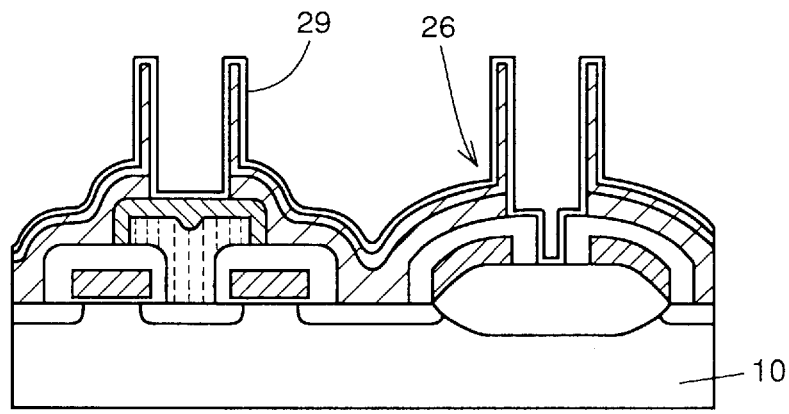
Figure 19:
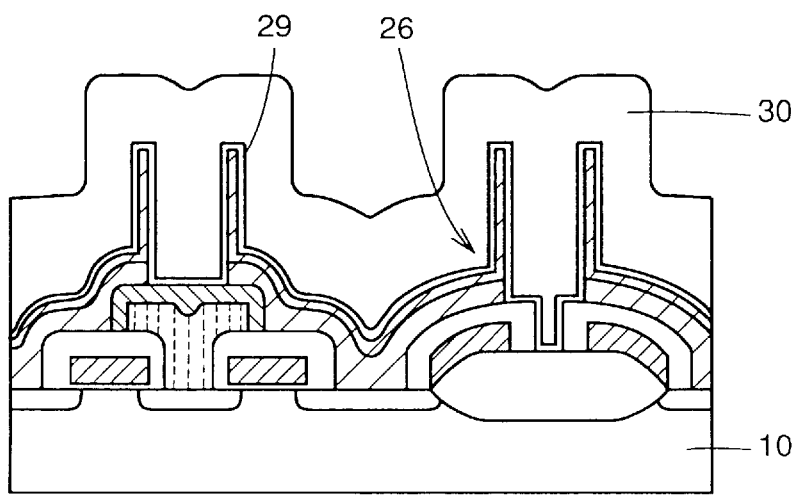
Figure 20:
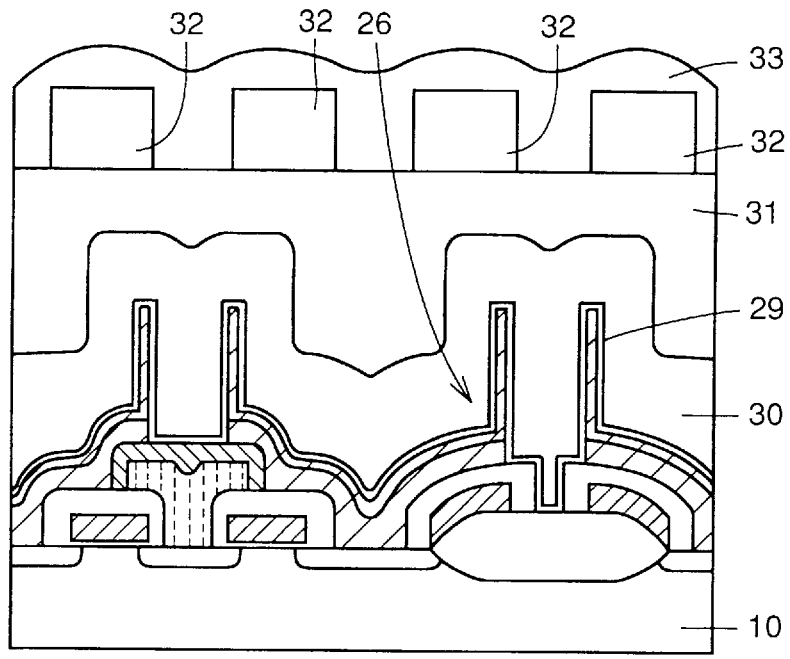
Figure 21:
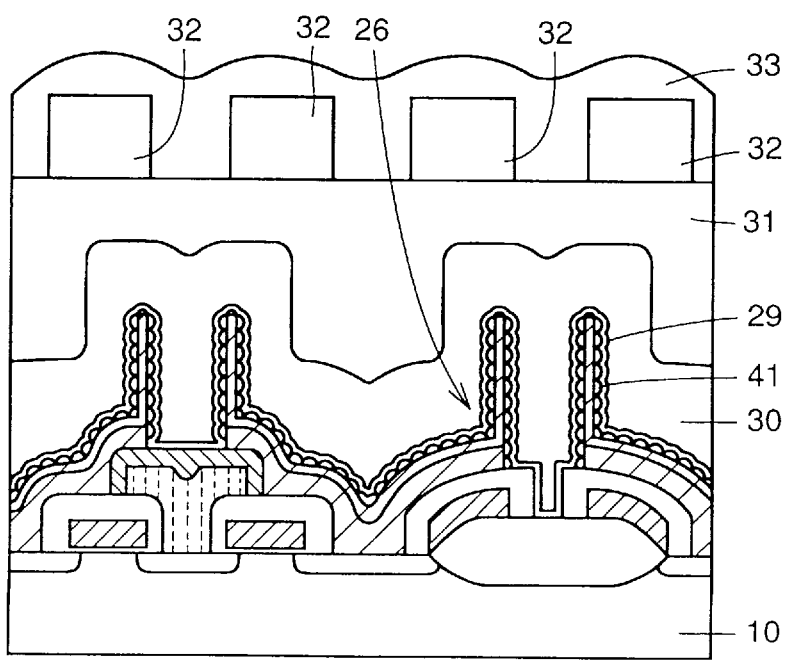
FIG. 21 is a cross section of a semiconductor memory device in another art relevant to the invention.
Figure 22:
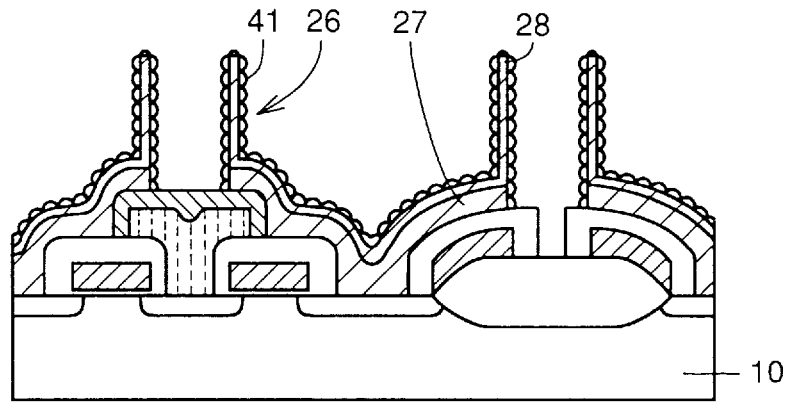
FIG. 22 is a fragmentary cross section of the semiconductor memory device at a major step in a process of manufacturing the semiconductor memory device shown in FIG. 21.
Figure 23:
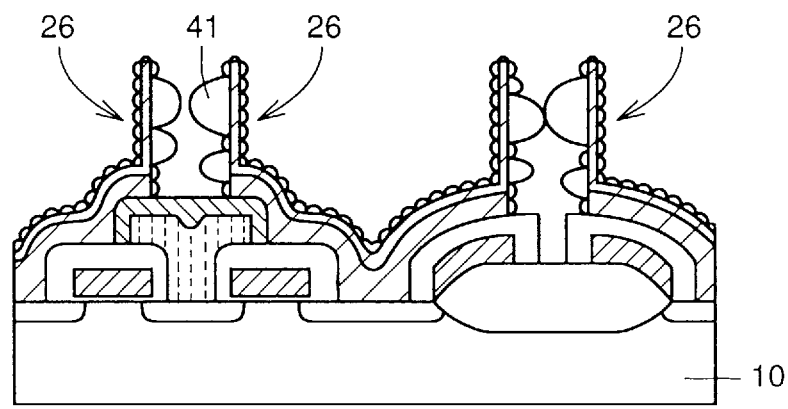
FIG. 23 is a fragmentary cross section of the semiconductor memory device for pointing out a problem in the process of manufacturing the semiconductor memory device shown in FIG. 21.

The semiconductor memory device of the embodiment is similar to the conventional semiconductor memory device shown in FIG. 5 except for points described below. The same or corresponding portions bear the same reference numbers and will not be described later.

The semiconductor memory device of the invention has a distinctive feature that the cylindrical storage node 26 formed of the bottom conductive portion 27 and side wall conductive portion 28 is provided at its inner wall with silicon particles 41 which are protruded conductors of hemispheric shape and are projected in a radially inward direction of the cylindrical shape of the storage node 26. There is provided the capacitor insulating film 29 which covers the whole outer surface of the cylindrical storage node 26 including the outer surfaces of the silicon particles 41. See FIG. 25.

The capacitor capacity of the semiconductor memory device having the above structure will be described below.

Figure 26A:
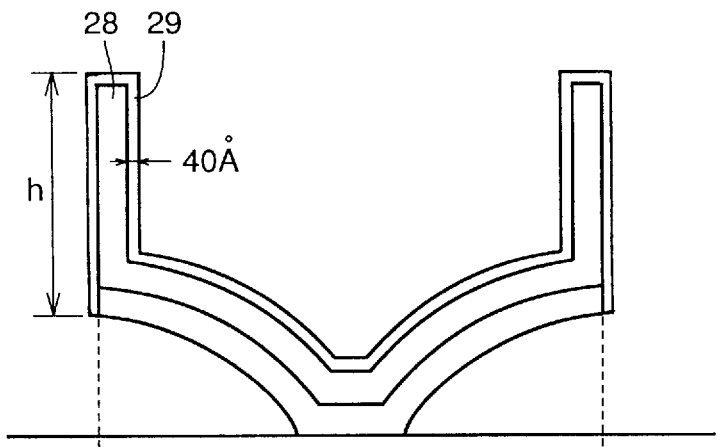
FIGS. 26A and 26B show distinctive features of the semiconductor memory device of the embodiment of the invention.
Figure 26B:
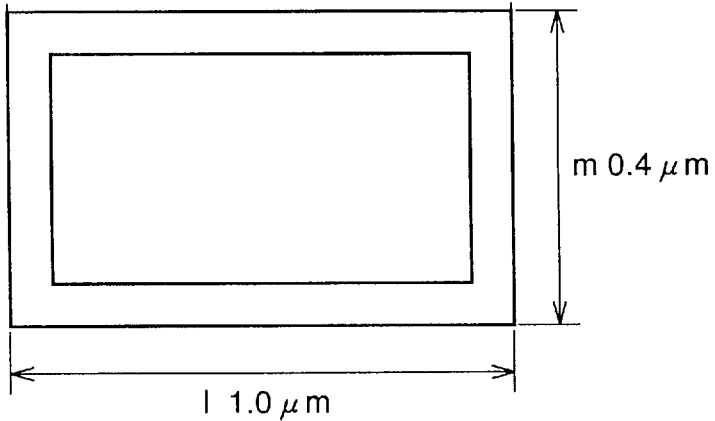

Referring to FIG. 26A and 26B represent a cross section and a plan of the storage node, it is assumed that the side wall conductive portion 28 has a height of 6000 Å and the storage node has the sizes (represented by l×m in FIG. 26B) of 1.0×0.4 μm, and that the capacitor insulating film has a thickness of 40 Å in terms of SiO2. In this case, a conventional device including no silicon particle has a capacitor capacity of 22 fF. Meanwhile, a capacitor capacity of 27 fF can be obtained in the embodiment in which the silicon particles are of hemispherical form as readily seen from their semi-circular cross-sections in FIGS. 24 and 25 and are formed on the inner wall of the cylindrical storage node to obtain the surface area of the capacitor capacity which is 1.5 times as large as that of the conventional capacitor. If the surface area of the capacitor is twice as large as that of the conventional device, the capacitor capacity of 33 fF is obtained. It should be noted that the capacitor capacity of 25 fF is required for ensuring the device characteristics.

Then, a method of manufacturing the semiconductor memory device shown in FIG. 24 will be described below.
Embodiment 1

FIGS. 27–54 are fragmentary cross sections of the semiconductor memory device at respective steps in the process of manufacturing the semiconductor memory device provided with cylindrical capacitors shown in FIG. 24.

Figure 27:
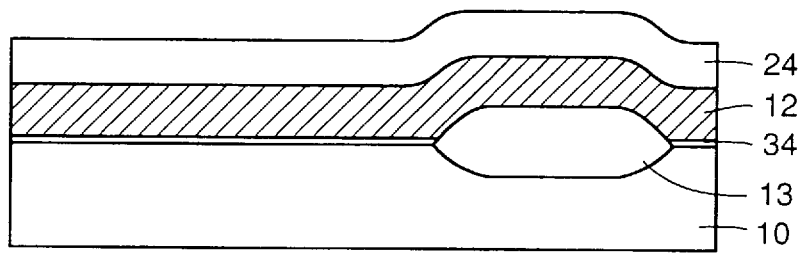
FIGS. 27–54 are fragmentary cross sections of the semiconductor memory device of the first embodiment of the invention at 1st to 28th steps in a process of manufacturing the semiconductor memory device, respectively.

Referring to FIG. 27, the field oxide film 13 is formed at the main surface of the silicon substrate 10. The gate oxide film 34 is formed on the surface of the silicon substrate 10. The word line film 12 and interlayer insulating film 24 are successively formed on the gate oxide film 34.

Figure 28:
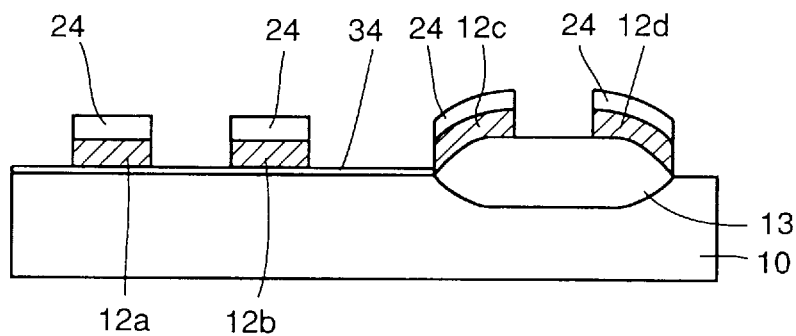

Referring to FIG. 28, the word line film 12 and interlayer insulating film 24 are selectively etched by photolithography to form a plurality of word lines 12a, 12b, 12c and 12d. At this step, the interlayer insulating films 24 are remained on each of the word lines 12a, 12b, 12c and 12d.

Figure 29:
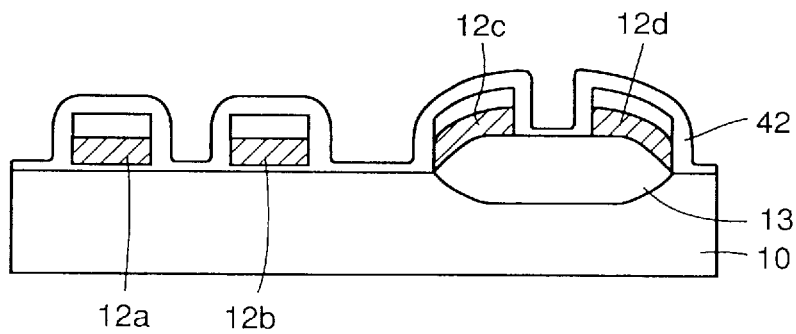

Referring to FIG. 29, an insulating film 42 is formed on the silicon substrate 10 to cover the word lines 12a, 12b, 12c and 12d.

Figure 30:
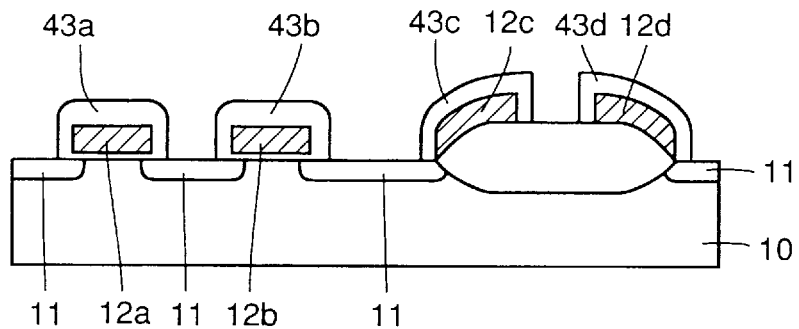

Referring to FIGS. 29 and 30, anisotropic etching is effected to etch the insulating film 42 for forming side wall spacers on the side walls of the word lines 12a, 12b, 12c and 12d. Thereby, the word lines 12a, 12b, 12c and 12d are covered with first insulating films 43a, 43b, 43c and 43d. Using the first insulating films 43a, 43b, 43c and 43d as a mask, impurity ions are implanted into the main surface of the silicon substrate 10, whereby the source/drain regions 11 are formed at the main surface of the silicon substrate 10.

Figure 31:
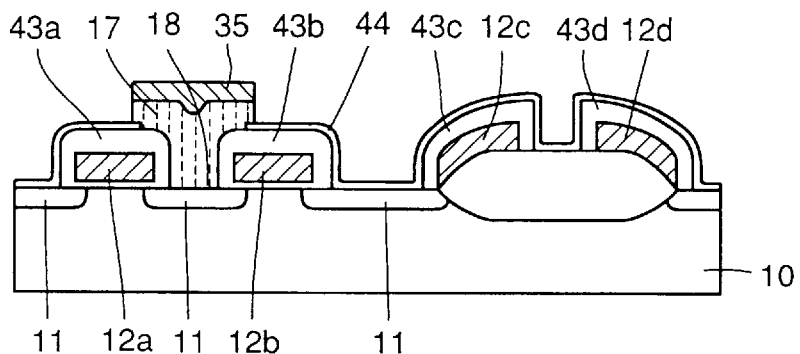

Referring to FIG. 31, an insulating film 44 is formed to cover the word lines 12a, 12b, 12c and 12d which are covered with the first insulating films 43a, 43b, 43c and 43d. The insulating film 44 is selectively etched to form the bit line contact hole 18. A bit line film and an insulating film (TEOS oxide film), which are in contact with the source/drain region 11 through the bit line contact hole 18, are sequentially formed on the silicon substrate 10. These bit line film and insulating film are selectively patterned to from the bit line 17. At this step, the insulating film 35 is remained on the bit line 17.

Figure 32:
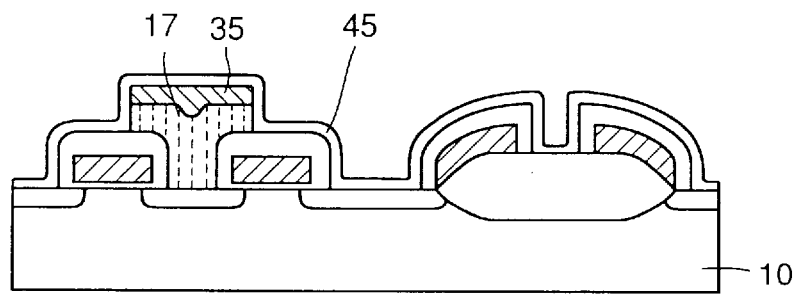

Referring to FIG. 32, an insulating film 45 is formed on the silicon substrate 10 to cover the bit line 17 provided with the insulating film 35.

Figure 33:
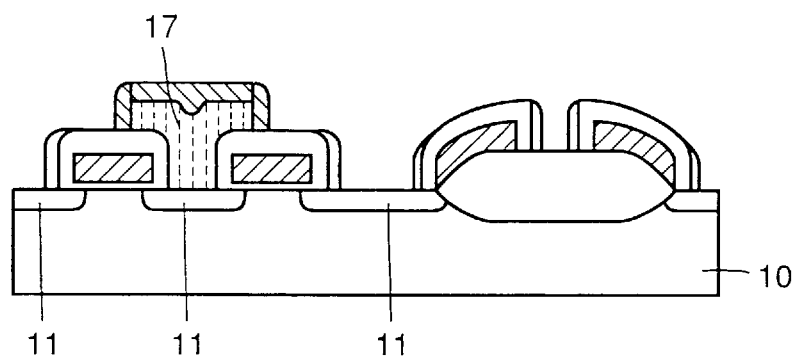

Referring to FIG. 33, the insulating film 45 is etched back to form side wall spacers on the side walls of the bit line 17 and expose partially the source/drain regions 11.

Figure 34:
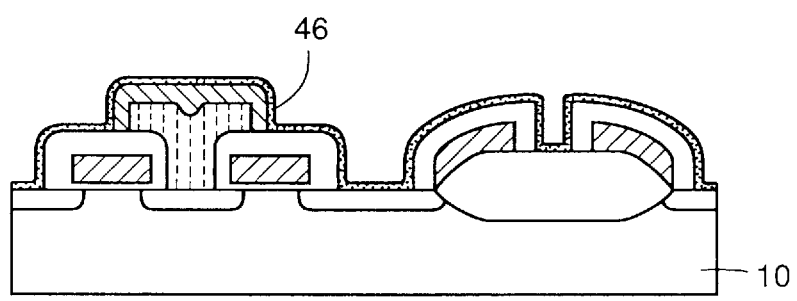

Referring to FIG. 34, the whole surface of the silicon substrate 10 is covered with a silicon nitride film 46.

Figure 35:
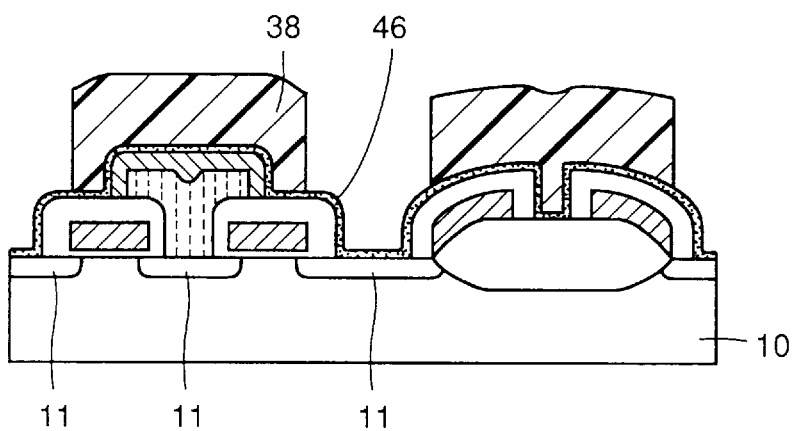
Figure 36:
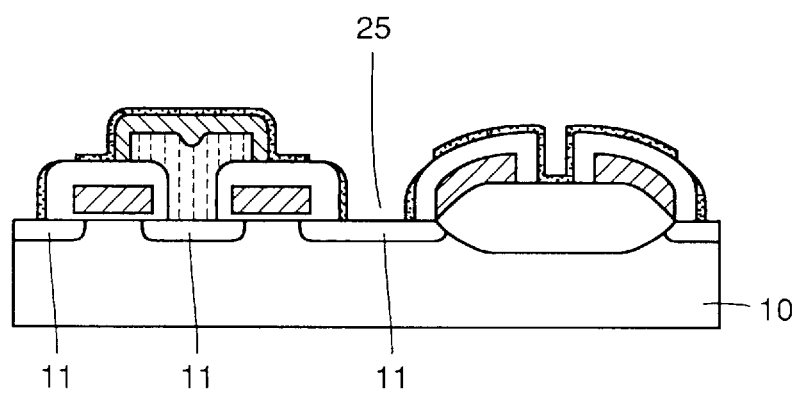

Referring to FIGS. 35 and 36, using the resist pattern 38 as a mask, the silicon nitride film 46 is selectively etched to form the contact hole 25 for exposing the surface of the other source/drain region 11. Then, the resist pattern 38 is removed.

Figure 37:
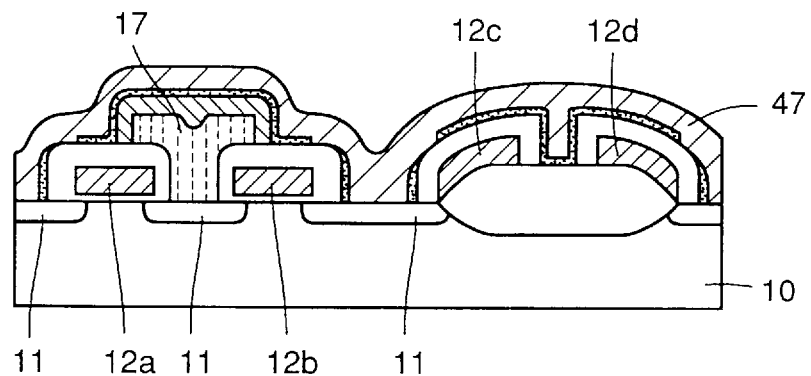

Referring to FIG. 37, a first silicon layer 47 containing phosphorus or the like added thereto is formed on the whole upper surface of the silicon substrate 10. The first silicon layer 47 is connected to the other source/drain region 11 and covers the bit line 17 and word lines 12a, 12b, 12c and 12d with insulating layers therebetween. The first silicon layer 47 is preferably amorphous.

Figure 38:
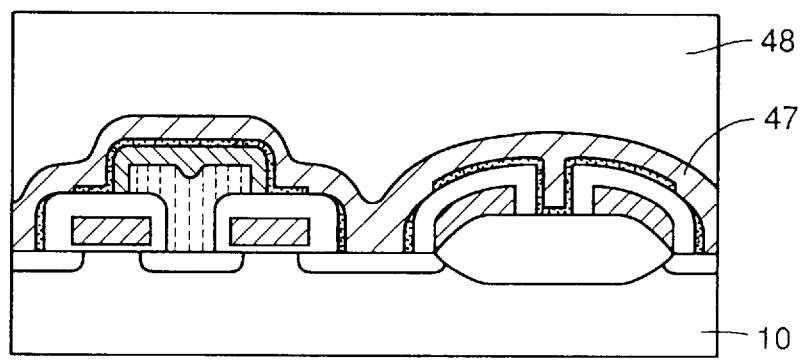

Referring to FIG. 38, an insulating film 48 made of a TEOS oxide film is formed on the first silicon layer 47. Formation of the insulating film 48 is preferably carried out at a relatively low temperature lower than about 500° C. so that the first silicon layer 47 may not change from amorphous to polysilicon.

Figure 39:
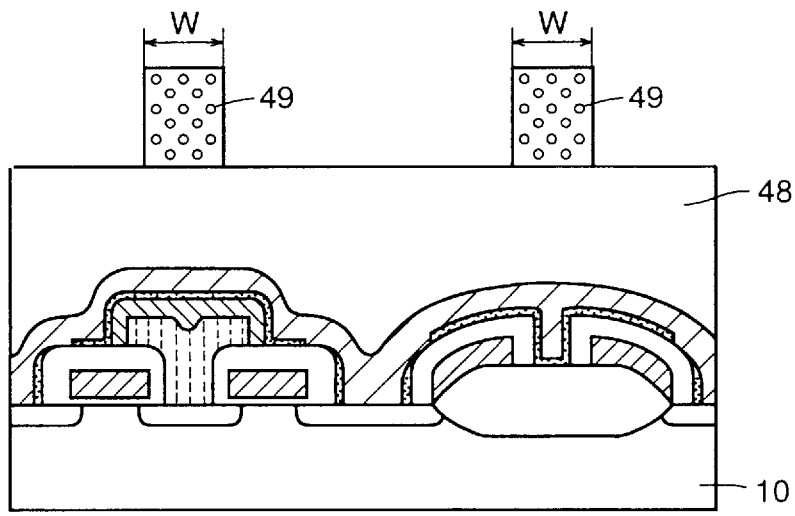

Referring to FIG. 39, resist patterns 49 having a predetermined configuration are formed on the insulating layer 48. A width w of the resist pattern 49 determines a distance between adjoining capacitors.

Figure 40:
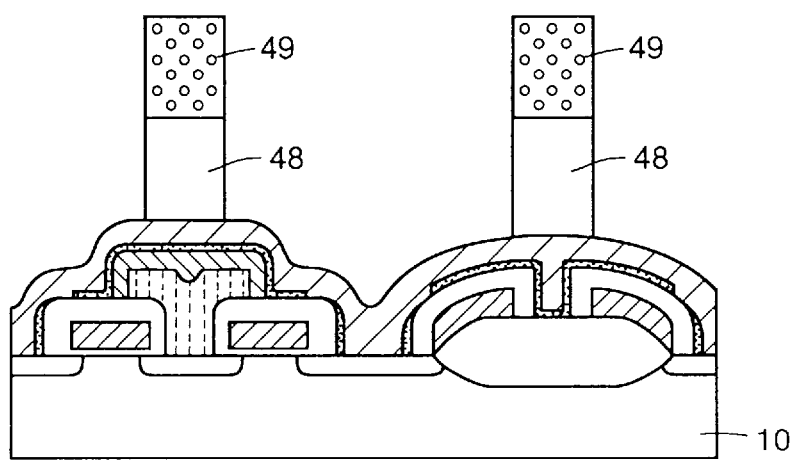
Figure 41:
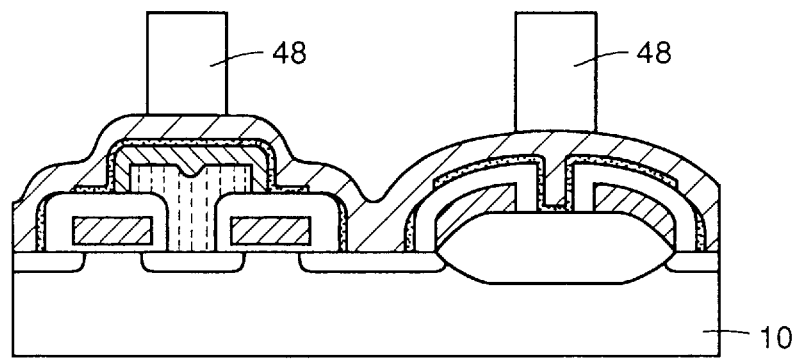

Referring to FIGS. 39 and 40, the insulating layer 48 is selectively etched, using the resist patterns 49 as a mask. Referring to FIGS. 40 and 41, the resist pattern 49 is removed.

Figure 42:
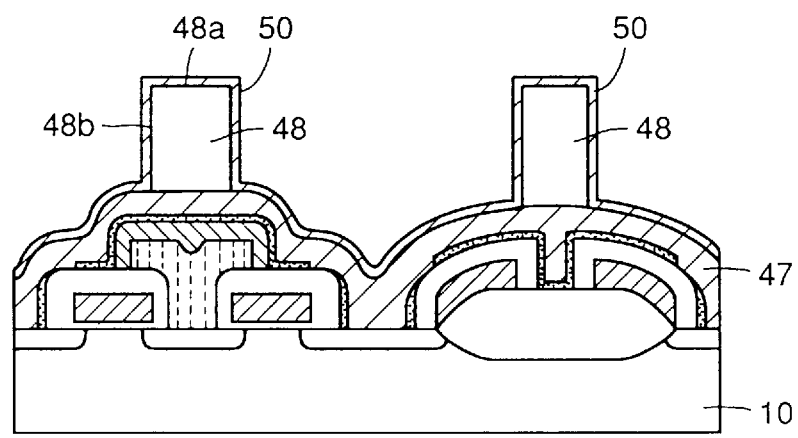

Referring to FIGS. 41 and 42, a second silicon layer 50 containing impurity such as phosphorus introduced thereinto is deposited by the CVD method on the whole upper surface of the first silicon layer 47 so that the second silicon layer 50 covers an upper end surface 48a and a side wall 48b of each insulating layer 48. The second silicon layer 50 is preferably amorphous.

Figure 43:
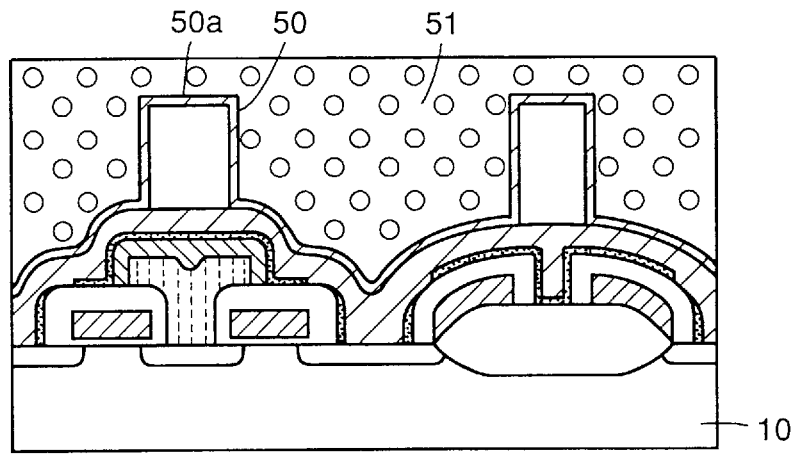

Referring to FIG. 43, resist 51 is applied to the surface of the silicon substrate 10 so that it completely covers an uppermost surface 50a of the second silicon layer 50.

Figure 44:
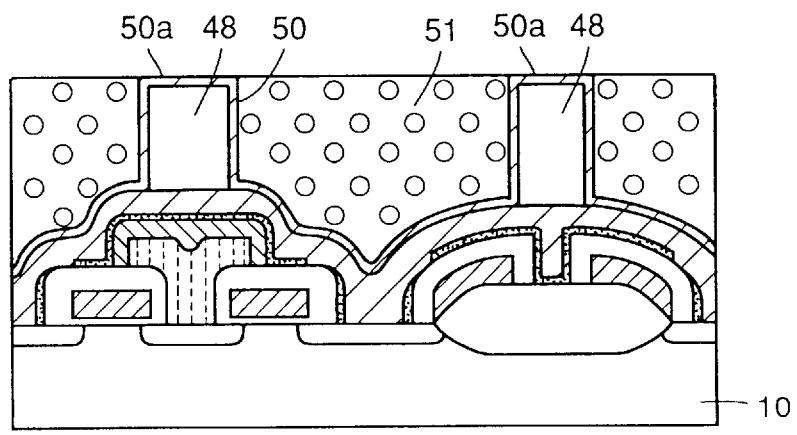

Referring to FIGS. 43 and 44, the resist 51 is etched back to expose the uppermost surface 50a of the second silicon layer 50.

Figure 45:
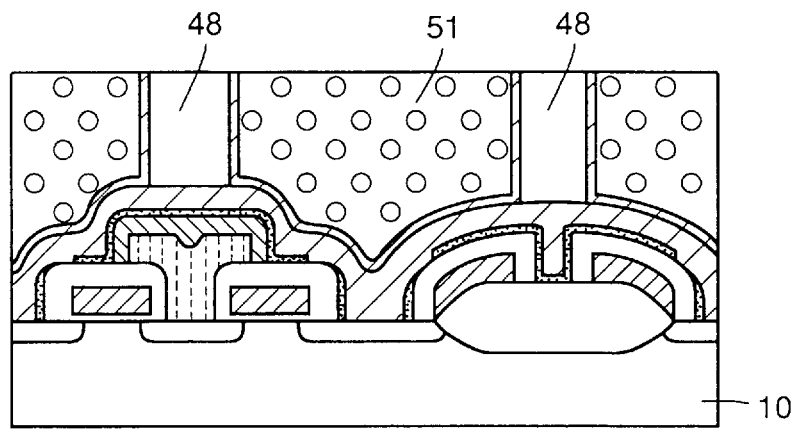

Referring to FIGS. 44 and 45, the exposed uppermost surface 50a of the second silicon layer 50 is removed by etching.

Figure 46:
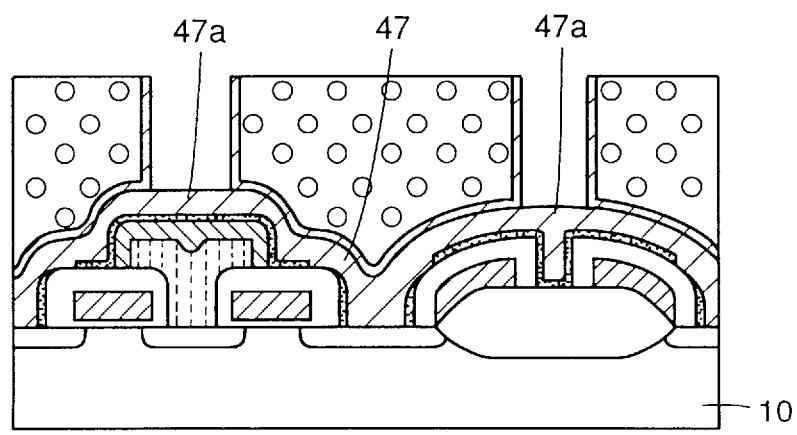

Referring to FIGS. 45 and 46, the insulating layer 48 is removed by etching with HF liquid or the like.

Figure 47:
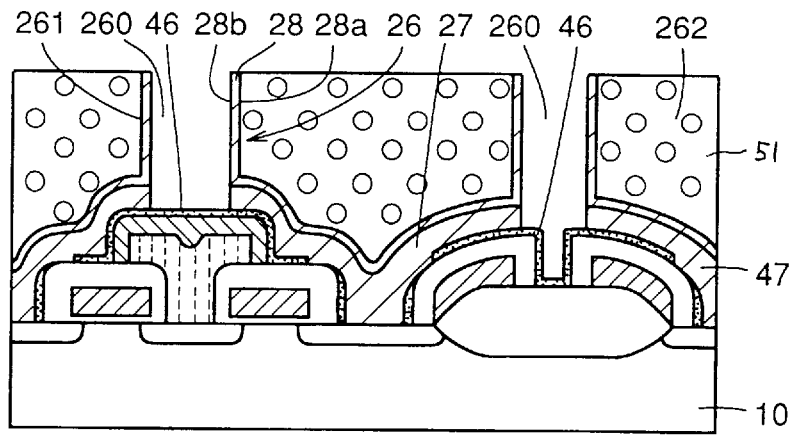

Referring to FIGS. 46 and 47, anisotropic etching is effected to remove the exposed portion 47a of the first silicon layer 47 in a self-aligning manner. In this processing, the silicon nitride film 46 functions as an etching stopper to prevent further etching.

By etching and removing the exposed portion 47a of the first silicon layer 47, the basic configuration of the cylindrical storage node 26 is completed, in which the bottom conductive portion 27 is connected to the other source/drain region 11 and spreads up to an area over the word lines 12a, 12b, 12c and 12d with the insulating layers therebetween, and the side wall conductive portion 28 continuously and upwardly extends from the outer periphery of the bottom conductive portion 27 and has the inner and outer walls 28a and 28b.

Figure 48:
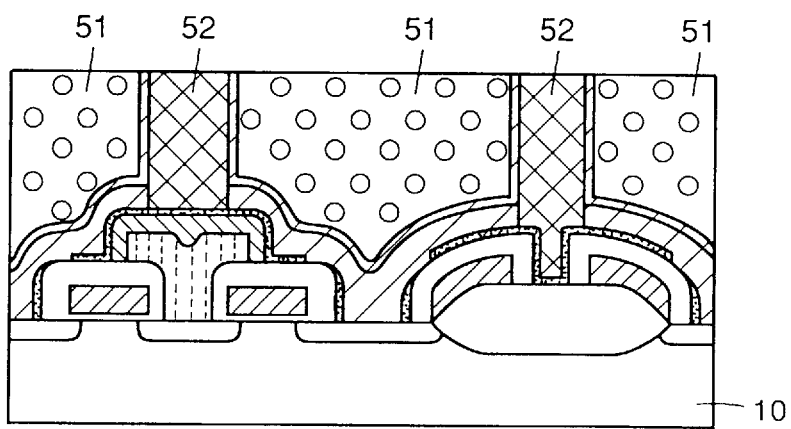

Referring to FIGS. 47 and 48, the cylindrical storage node 26 and each of cylindrical storage nodes 261 and 262 adjoining to the cylindrical storage node 26 define a space 260 between them, which is filled with an insulating film 52 in a liquid state such as spin-on glass. Filling with the insulating film 52 is carried out by etch back of a spin-on glass film applied to the whole surface of the silicon substrate 10.

Figure 49:
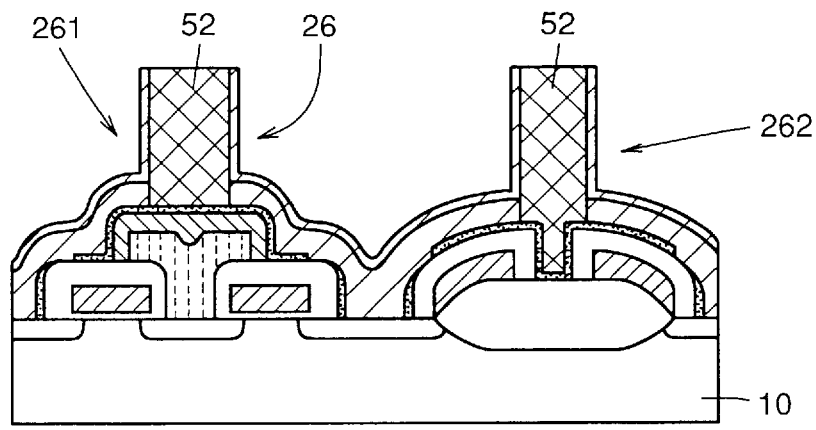

Referring to FIGS. 48 and 49, the resists 51 filling the storage nodes 26, 261 and 262 are removed by etching with $O_2$ plasma.

Figure 50:
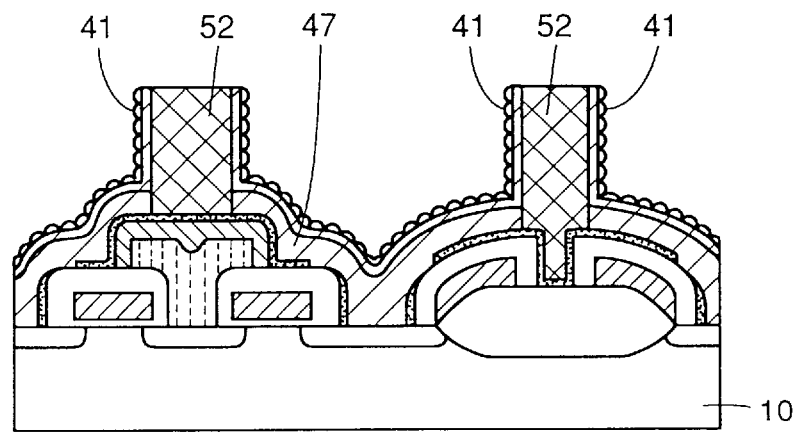

Referring to FIGS. 49 and 50, the silicon substrate 10 is rinsed off with acid and alkali, and then, the silicon substrate 10 is placed in a CVD chamber (not shown). The pressure-reduced CVD chamber is set to a temperature of 600° C. and a high vacuum condition of not more than ×10−7 Torr. Thereafter, $Si_2H_6$ gas is introduced into the pressure-reduced CVD chamber for 10 to 20 seconds. Thereby, minute silicon particles 41, i.e., protruded conductors are formed on the inner walls of the cylindrical storage nodes 26, 261 and 262. The silicon particle 41 has a hemispherical shape with a diameter of about 100 Å. The silicon particles 41 are formed by the following mechanism. First, thin films of silicon are formed on the inner walls of the cylindrical storage nodes 26, 261 and 262, and then, owing to rise of the temperature, silicon cores gather to form the minute silicon particles 41. Formation of the silicon particles 41 is promoted if the first silicon layer 47 is amorphous.

Figure 51:
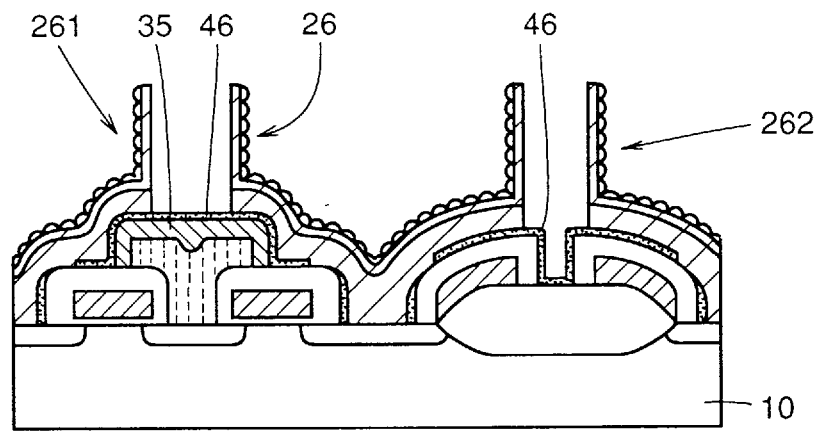

Referring to FIGS. 50 and 51, the insulating film 52 is removed with HF liquid. In this processing, the insulating layer 35 is not etched owing to existence of the silicon nitride film 46.

Figure 52:
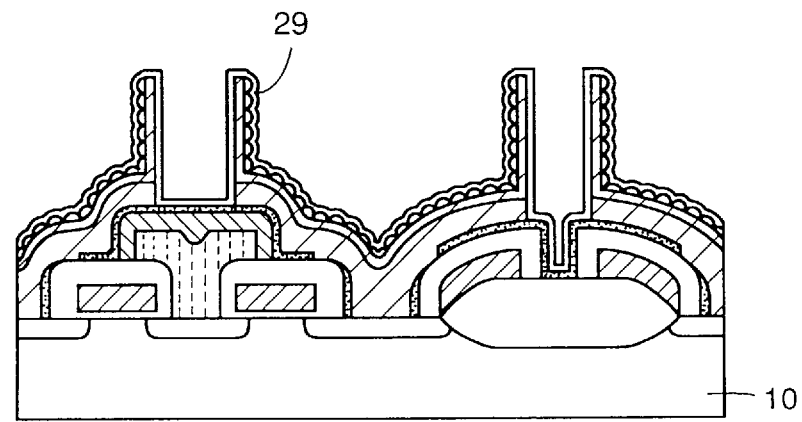

Referring to FIGS. 51 and 52, the capacitor insulating film 29 which is a high dielectric film made of compound containing silicon nitride, silicon oxide, tantalum pentaoxide, hafnium oxide, BaSrTiO$_2$, PbZnTiO or SrTiO is formed on the outer surfaces of the cylindrical storage nodes 26, 261 and 262.

Figure 53:
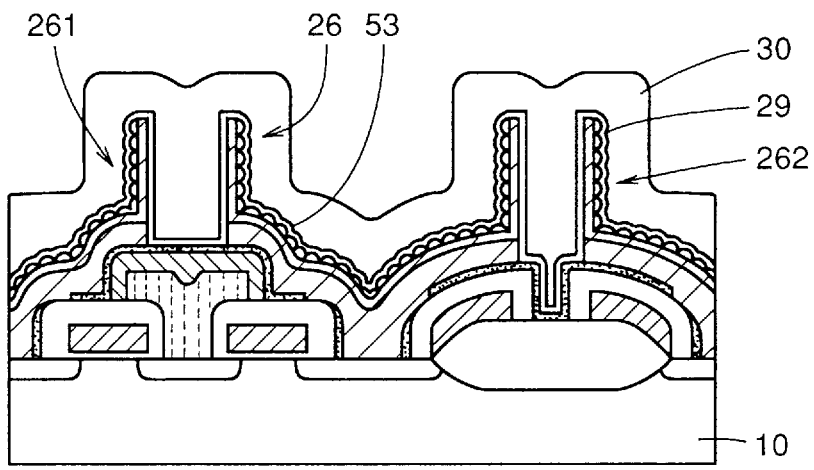

Referring to FIG. 53, the cell plate 30 is formed on the silicon substrate 10 to cover the outer surfaces of the cylindrical storage nodes 26, 261 and 262 with the capacitor insulating film 29 therebetween. The cell plate 30 may be made of polysilicon into which impurity is introduced.

Figure 54:
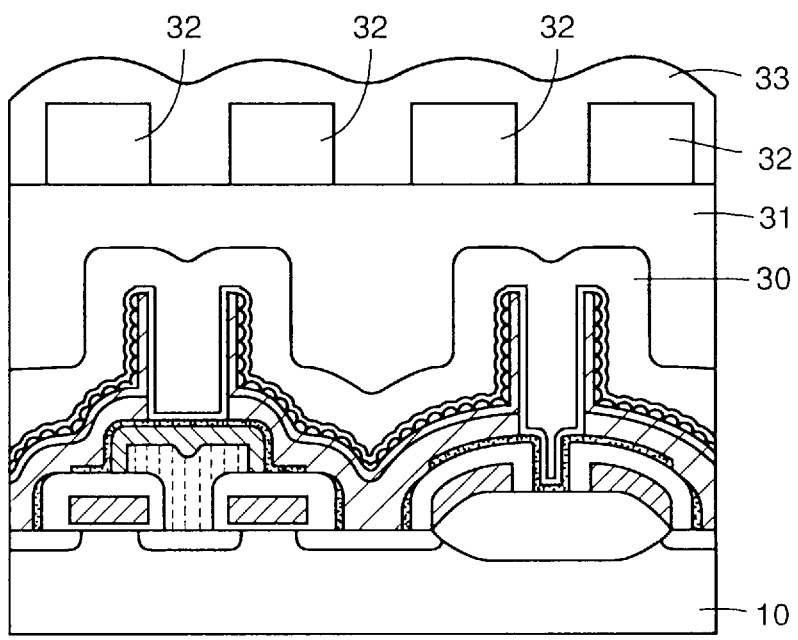

Referring to FIG. 54, the interlayer insulating film 31 is formed on the whole surface of the silicon substrate 10 to cover the cell plate 30. The interconnection layers 32 having predetermined configurations are formed on the interlayer insulating film 31. The protection film 33 is formed on the whole surface of the silicon substrate 10 to cover the interconnection layers 32.

The semiconductor memory device having the cylindrical capacitors which is manufactured as described above can ensure a sufficient capacitor capacity with a small occupied area.

Embodiment 2

This embodiment relates to another method of forming the protruded conductors on the inner wall of the cylindrical storage node.

Although not shown, the same steps as those shown in FIGS. 27–33 are first carried out similarly to the embodiment 1.

Figure 55:
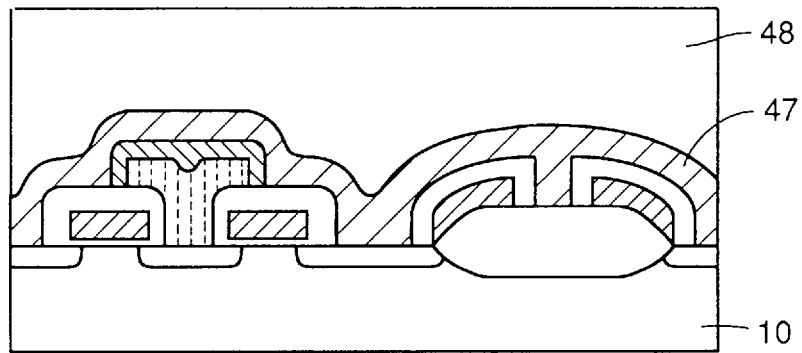
FIGS. 55–68 are fragmentary cross sections of a semiconductor memory device of a second embodiment of the invention at 1st to 14th steps in a process of manufacturing the semiconductor memory device, respectively.

Referring to FIG. 55, the insulating layer 48 is formed on the first silicon layer 47.

Figure 56:
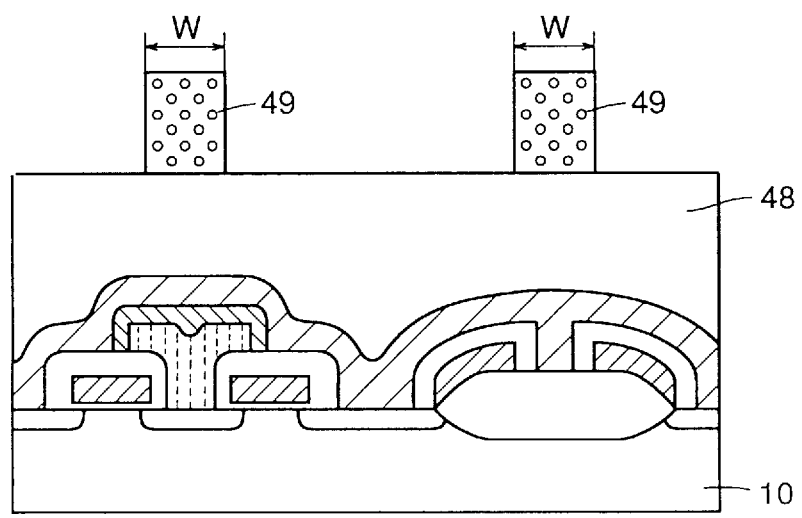

Referring to FIG. 56, resist patterns 49 having a predetermined configuration is formed on the surface of the insulating layer 48. The width w of each resist pattern 49 determines a distance between adjoining capacitors.

Figure 57:
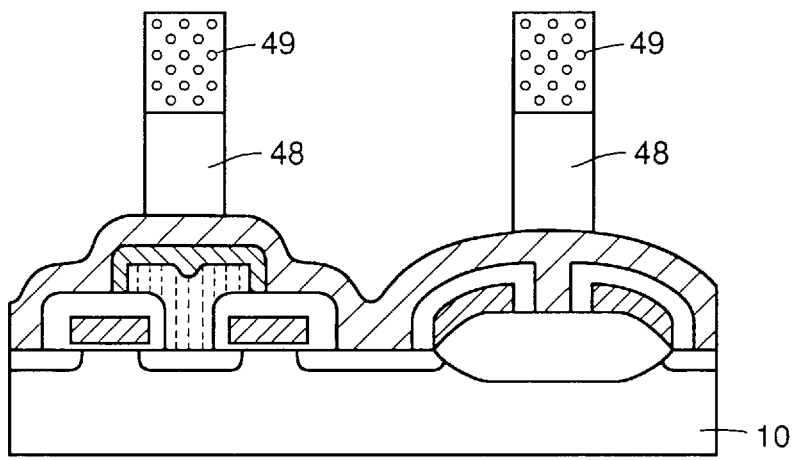

Referring to FIGS. 56 and 57, the insulating layer 48 is selectively etched using the resist patterns 49 as a mask.

Figure 58:
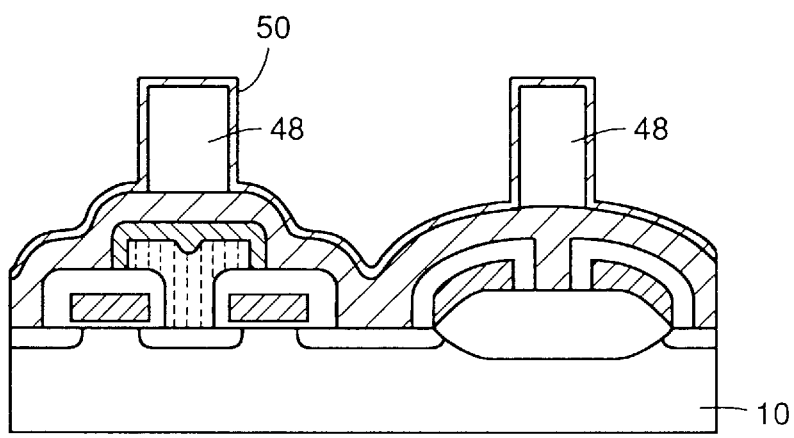
Figure 59:
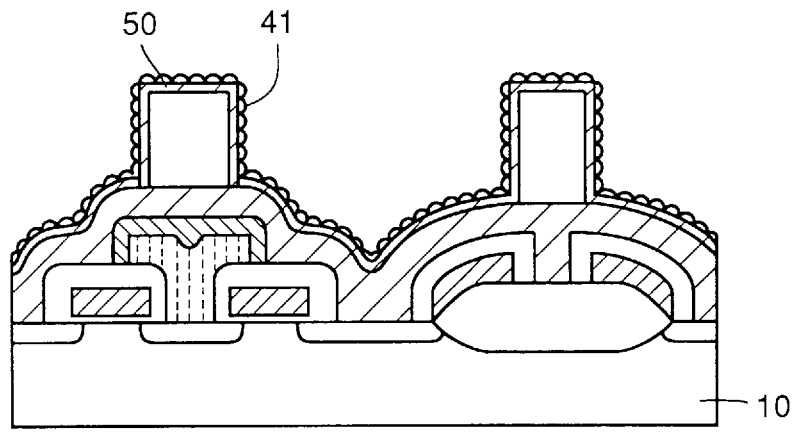

Referring to FIGS. 57 and 58, the resist patterns 49 are removed, and then the second silicon layer 50 containing impurity such as phosphorus introduced thereinto is deposited on the whole surface of the silicon substrate 10 by the CVD method to cover the upper end surface and side wall of each insulating layer 48 The silicon substrate is placed in the pressure-reduced CVD chamber. The pressure-reduced CVD chamber is set to a temperature of 600° C. and a high vacuum condition of not more than 1×10-7 Torr. Si$_2$H$_6$ gas is introduced into the pressure-reduced CVD chamber for 10 to 20 seconds, whereby the silicon particles 41 are formed on the whole surface of the second silicon layer 50 as shown in FIG. 59.

Figure 60:
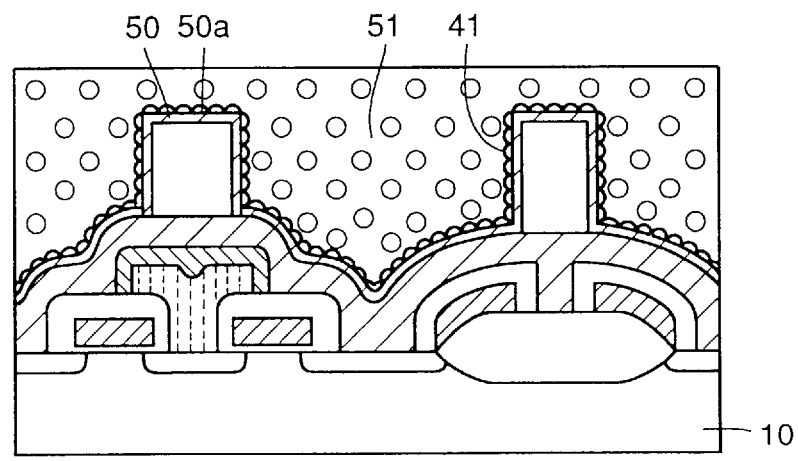

Referring to FIG. 60, the resist 51 is applied to the surface of the silicon substrate 10 so that it completely covers the uppermost surface 50a of the second silicon layer 50.

Figure 61:
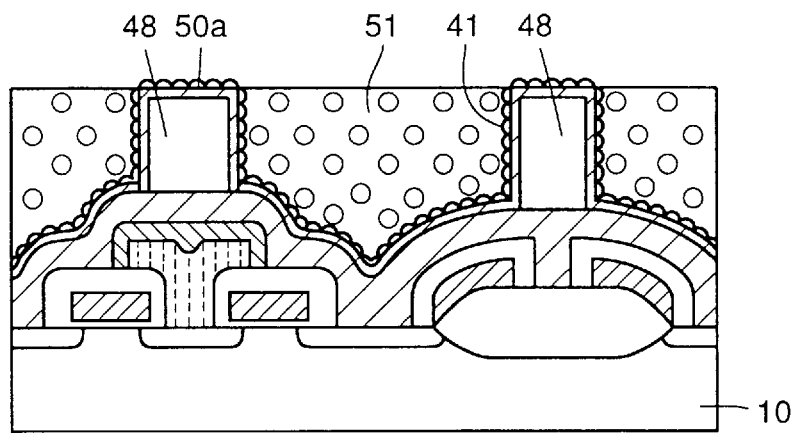

Referring to FIGS. 60 and 61, the resist 51 is etched back to expose the uppermost surface 50a of the second silicon layer 50.

Figure 62:
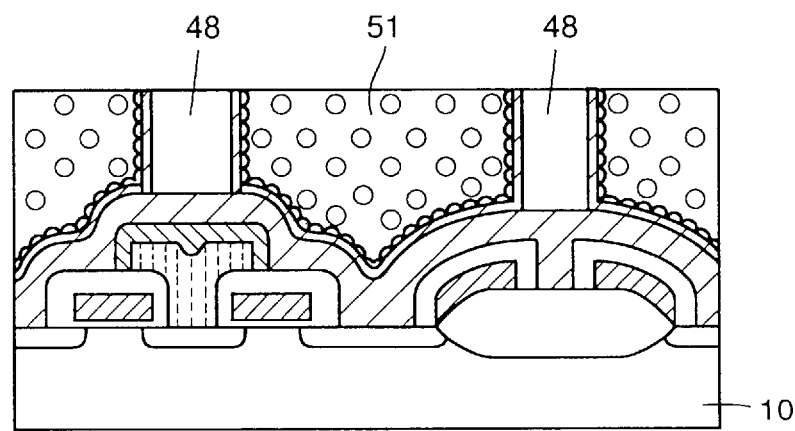

Referring to FIGS. 61 and 62, the uppermost surface 50a of the second silicon layer 50 is etched and removed to expose the upper end surface of each insulating layer 48.

Figure 63:
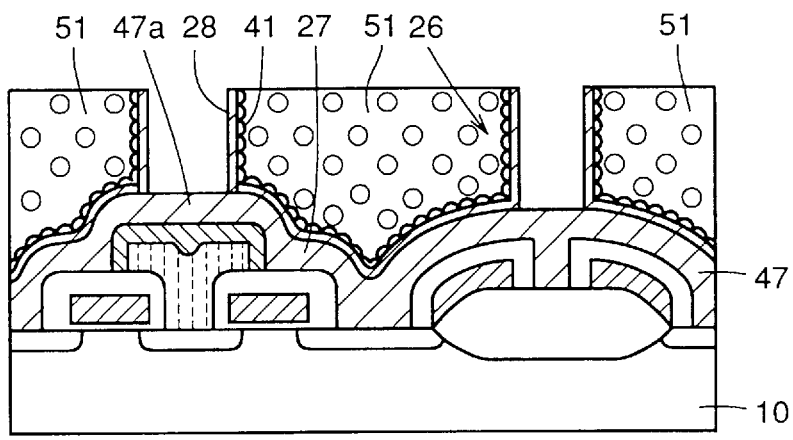

Referring to FIGS. 62 and 63, the insulating layer 48 is removed by effecting etching on its exposed portion with HF liquid or the like.

Figure 64:
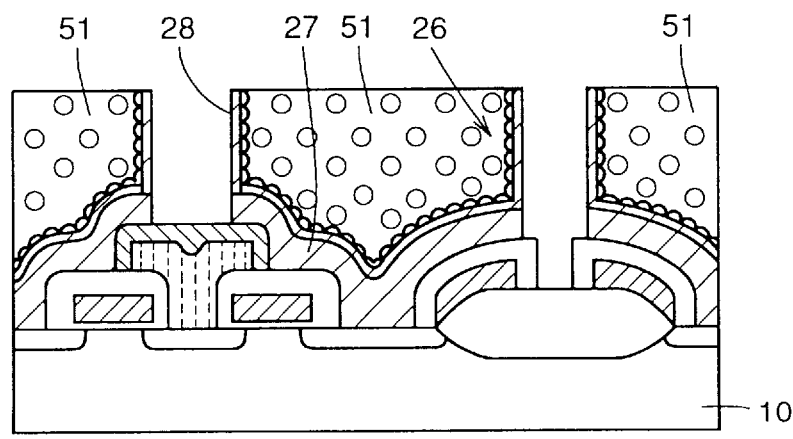

Referring to FIGS. 63 and 64, by etching the exposed portion 47a of the first silicon layer 47, the basic configuration of the cylindrical storage node 26 is completed, in which the bottom conductive portion 27 is provided at its inner wall with the silicon particles 41, and the side wall conductive portion 28 continuously and upwardly extends from the outer periphery of the bottom conductive portion 27 and is provided at its inner wall with the silicon particles 41.

Figure 65:
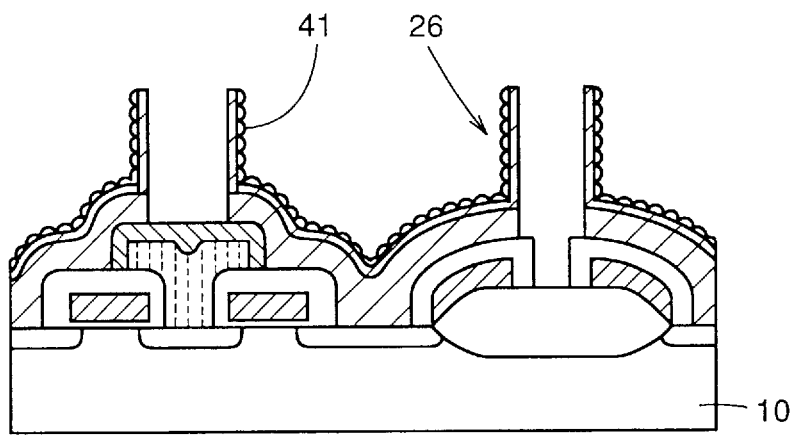

Referring to FIGS. 64 and 65, the resist 51 is removed.

Figure 66:
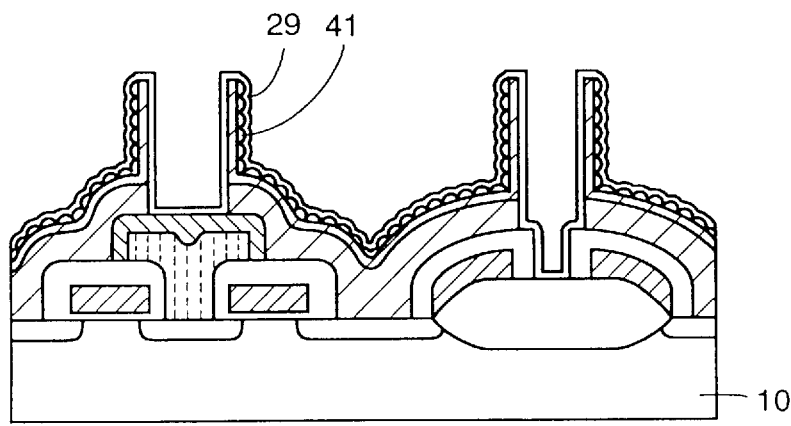

Referring to FIGS. 65 and 66, the capacitor insulating film 29 is formed on the whole surface of the silicon substrate 10 to cover the outer surface of the cylindrical storage node 26 including the surfaces of the silicon particles 41.

Figure 67:
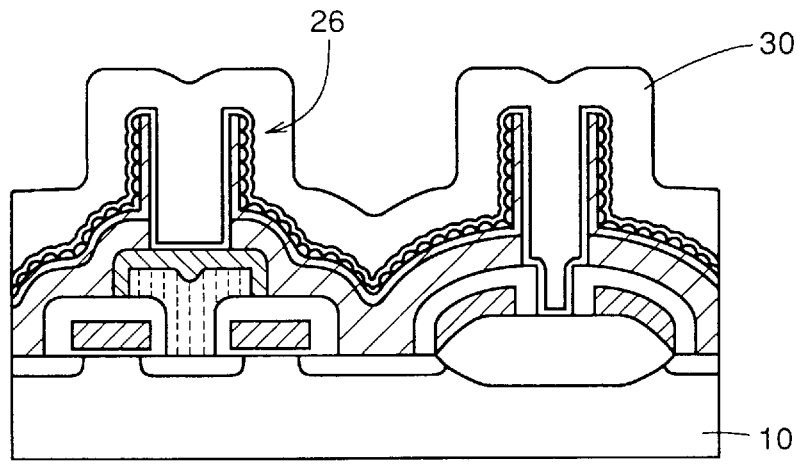

Referring to FIGS. 66 and 67, the cell plate 30 is formed over the outer surface of the cylindrical storage node 26 with the insulating film 29 therebetween. The interlayer insulating film 31 is formed on the silicon substrate 10 to cover the cell plate 30.

Figure 68:
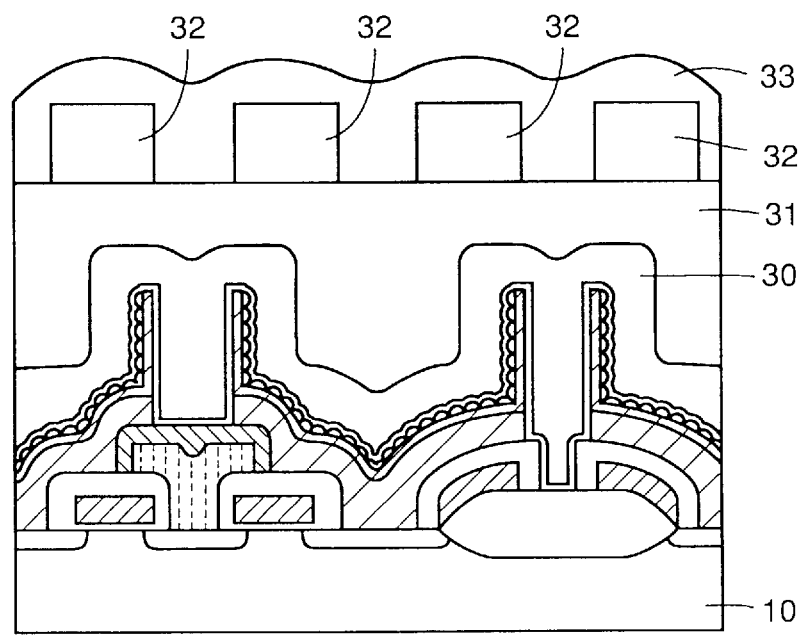

Referring to FIGS. 67 and 68, the interconnection layers 32 are formed on the interlayer insulating film 31. The protection film 33 is formed on the interlayer insulating film 31 to cover the interconnection layers 32.

Embodiment 3

Figure 69A:
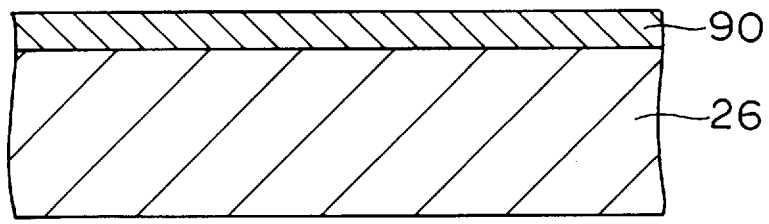
FIGS. 69A, 69B, 69C and 69D are cross sections showing a basic concept of a method of manufacturing a semiconductor memory device according to a third embodiment of the invention.

FIGS. 69A, 69B, 69C and 69D show a basic concept of a method of manufacturing the semiconductor memory device according to this embodiment. Referring to FIG. 69A, a metal film, i.e., Ti film 90 of about 500 to 1000 Å in thickness is deposited by the sputter method on the storage node 26 made of silicon.

Figure 69B:
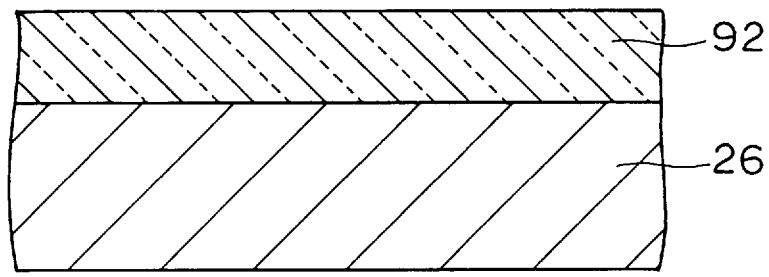

Referring to FIGS. 69A and 69B, the storage node 26 covered with the Ti film 90 is heated in insert gas such as Ar at a temperature of 800° to 900° C. for more than 30 seconds to change the Ti film 90 into a silicide film 92 (TiSi2). In the case of Ti, the silicide film 92 has the uniform thickness as shown at FIG. 69B when treated at a temperature not lower than 700° C.

Figure 69C:
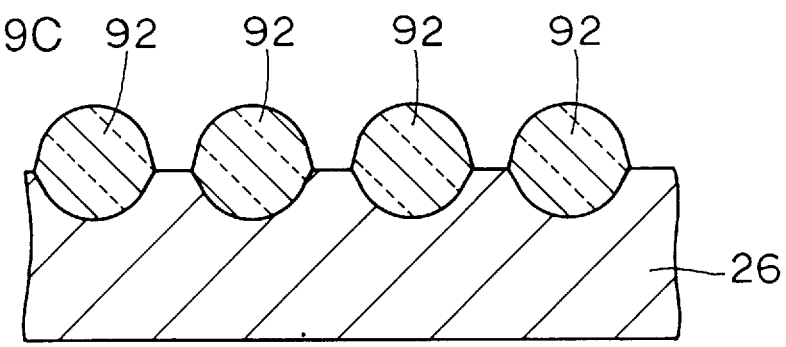

However, treatment at a high temperature higher than 800° C. promotes condensing reaction of the silicide film 92 as shown at FIG. 69C. This condensing reaction is similar to a phenomenon in which a water droplet changes into a spherical form on a glass plate to minimize its surface area, and is a phenomenon in which atoms move to minimize the surface energy of TiSi2 itself and which becomes remarkable as the temperature rises.

Figure 69D:
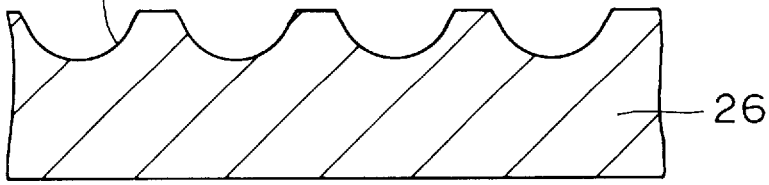

Referring to FIG. 69D, the condensed TiSi2 films 92 are removed with HF liquid or the like to leave hemisphere-shaped portions 93 at the surface of the silicon substrate. Thereafter, the capacitor insulating film is formed on the surface of the silicon storage node 26, whereby the capacitor having a large surface area is obtained.

Although Ti has been described as an example of component of the metal film, Ta, Hf and Zr may be preferable.

FIGS. 70–74 are cross sections showing a method of manufacturing the semiconductor memory device including the cylindrical capacitor to which the aforementioned basic concept is applied.

First, steps shown in FIGS. 27–47 are carried out.

Figure 70:
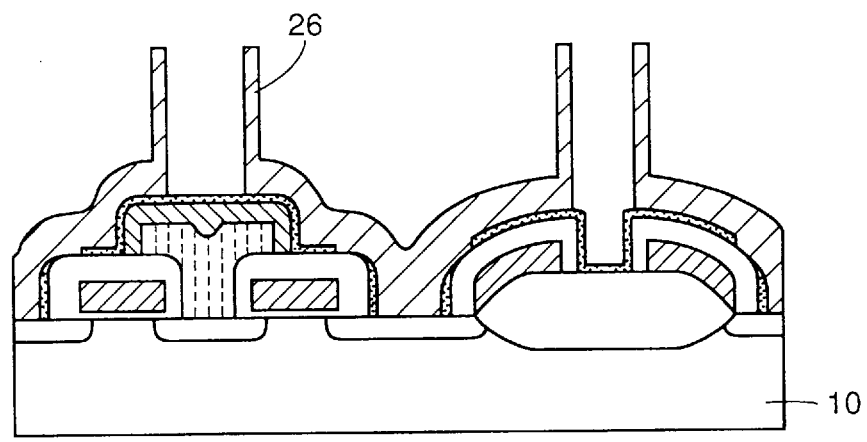
FIGS. 70–74 are fragmentary cross sections of a semiconductor memory device of the third embodiment of the invention at 1st to 5th steps in a process of manufacturing the semiconductor memory device, respectively.

Thereafter, the resist 51 is removed as can be seen from FIGS. 47 and 70.

Figure 71:
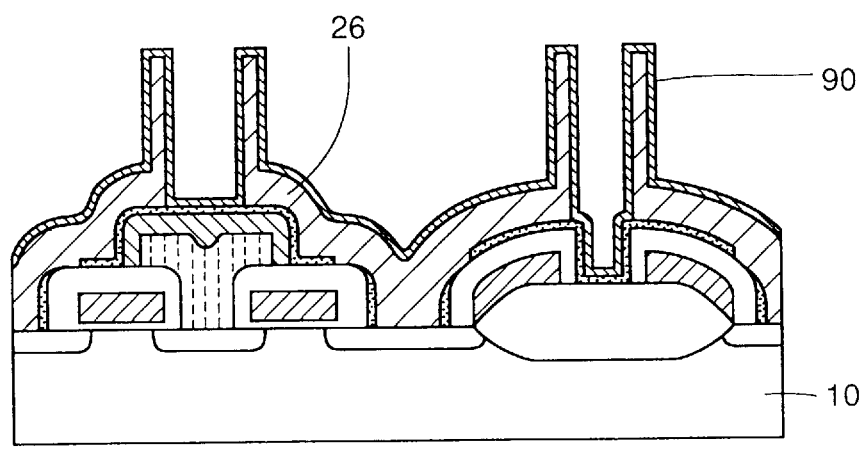

Referring to FIG. 71, the Ti film 90 is deposited on the whole surface of the cylindrical storage node 26 by the sputter method.

Figure 72:
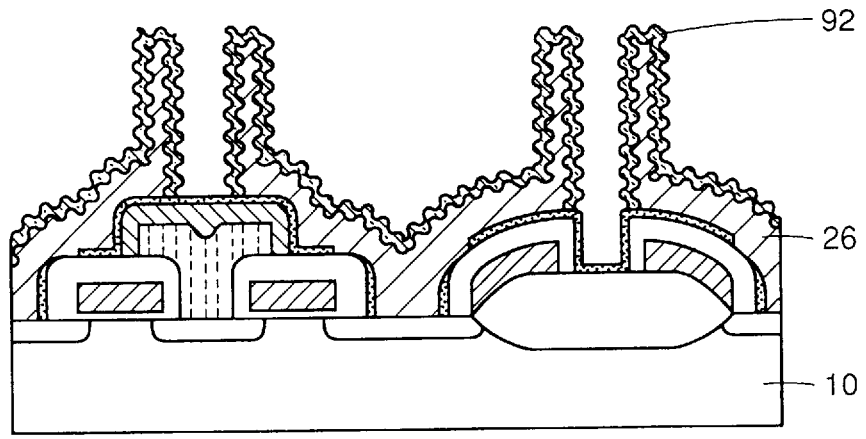

Referring to FIGS. 71 and 72, the cylindrical storage node 26 covered with the Ti film 90 is thermally processed in Ar at a temperature of 900° C. for 60 minutes by the lamp anneal method. Owing to this heat treatment, the Ti film 90 changes into the silicide film 92 and further changes into the condensed forms as shown in the figure.

Figure 73:
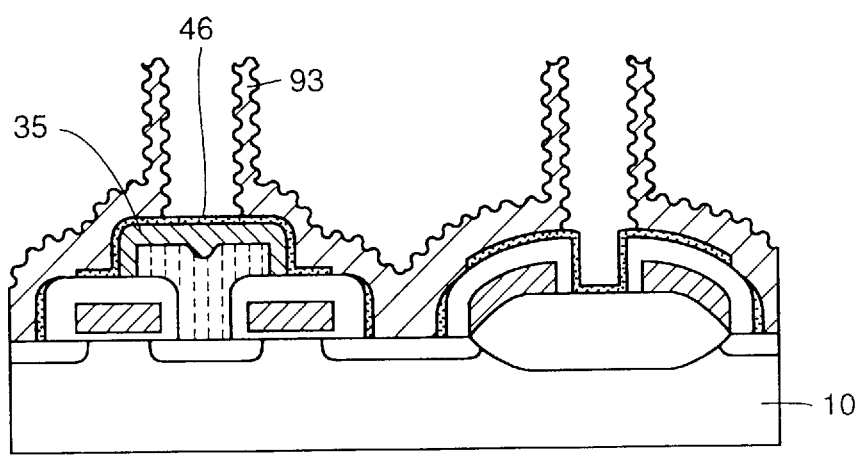

Referring to FIGS. 72 and 73, the silicide films 92 are removed by etching in solution containing HF. Although the TiSi2 dissolves in HF, Si does not substantially dissolve in HF. By removing the silicide films 92, the storage node 26 has the surface which is complementary in shape to the TiSi2/Si interface and has the hemispherical concave portions 93 hollowed inwardly from the outer surface. During the processing with the HF solution, the insulating film 35 formed of the TEOS oxide film is not etched because it is protected by the SiN film 46.

In this embodiment, metal such as Ti may contaminate the storage node 26. However, the oxide of metal such as Ti has a high dielectric constant, and the use of the same as a capacitor insulating film has been studied. Therefore, no problem is caused even if metal such as Ti and Ta remains in Si of the storage node 26.

Figure 74:
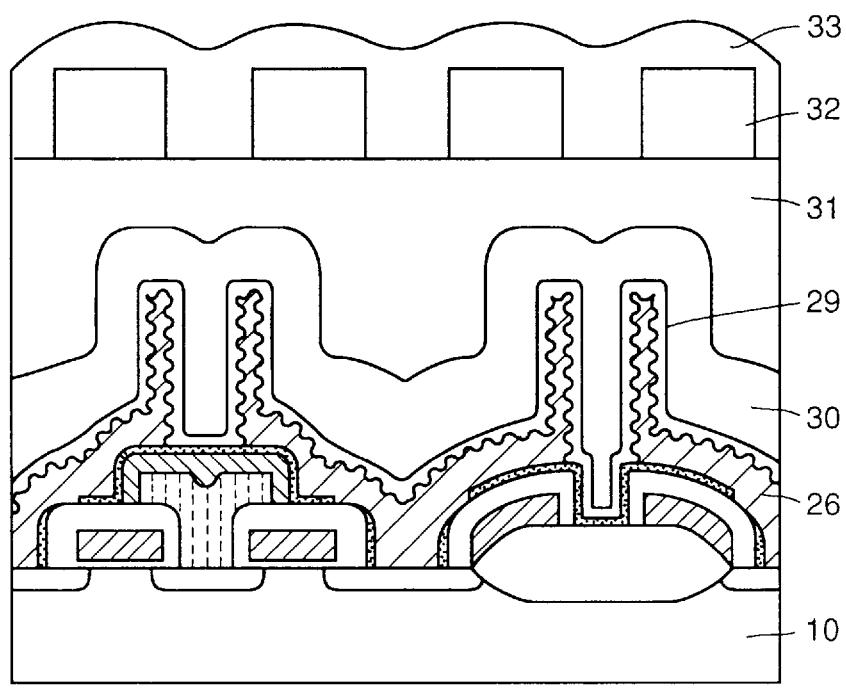

Referring to FIG. 74, the outer surface of the cylindrical storage node 26 is covered with the capacitor insulating film 29. The cell plate 30 is formed on the silicon substrate 10 to cover the outer surface of the cylindrical storage node 26 with the capacitor insulating film 29 therebetween. The interlayer insulating film 31 is formed on the surface of the silicon substrate 10 to cover the cell plate 30. The interconnection layers 32 having a predetermined configuration are formed on the interlayer insulating film 31. The protection film 33 is formed on the whole surface of the silicon substrate 10 to cover the interconnection layers 32.

The semiconductor memory device having the cylindrical capacitors which is manufactured as described above can sufficiently ensure the capacitor capacity with a small occupied area.

Embodiment 4

Figure 75:
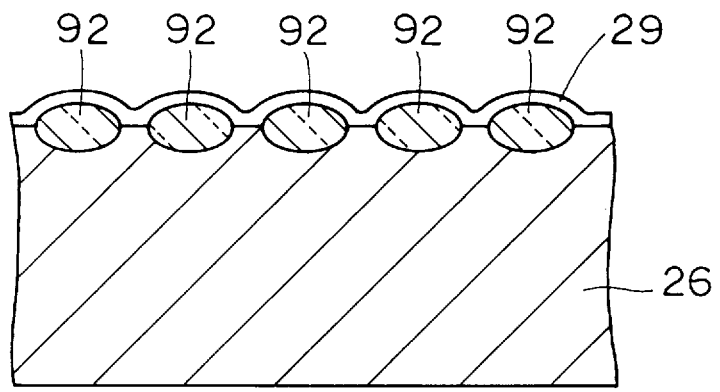
FIG. 75 is a cross section of a major portion of a semiconductor memory device according to a fourth embodiment of the invention.

In the aforementioned embodiment, it has been described, as an example, that the silicide films 92 are removed after condensing them as shown in FIGS. 72 and 73. In this embodiment 4, as shown in FIG. 75, the capacitor insulating film 29 is deposited on the whole surface of the storage node 26 without removing the silicide films 92. In this embodiment, the storage node 26 is provided with hemispherical outward convex portions 92. Also in this embodiment, the storage node 26 can have the outer surface of a large area, and thus can sufficiently ensure the capacitor capacity.

Embodiment 5

Figure 76:
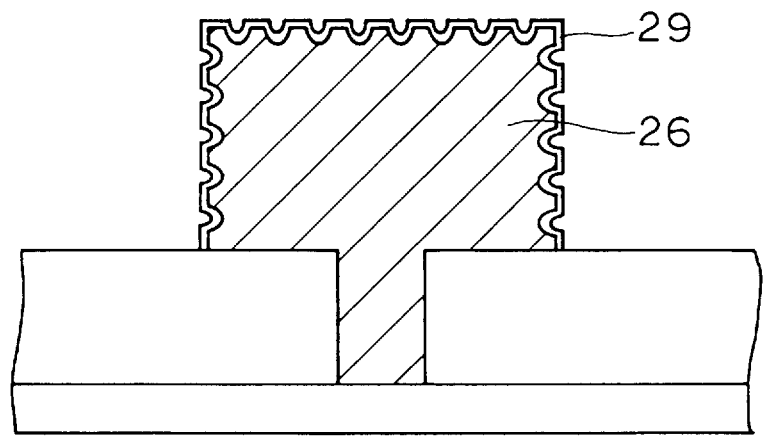
FIG. 76 is a cross section of a major portion of a semiconductor memory device according to a fifth embodiment of the invention.

The embodiments which have been described have the storage nodes of the cylindrical form as shown in FIG. 74. The present invention, however, is not restricted to them, and may be applied to a structure including stacked capacitors as shown in FIG. 76.

Embodiment 6

Figure 77:
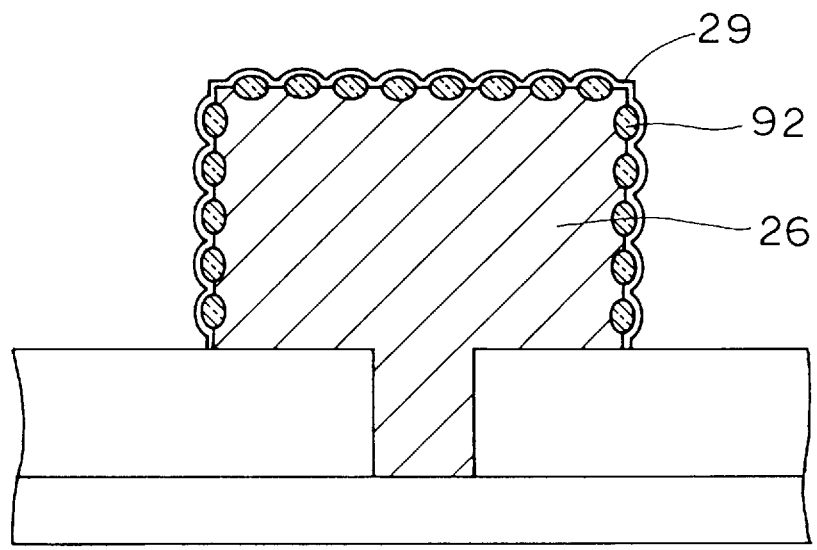
FIG. 77 is a cross section of a major portion of a semiconductor memory device according to a sixth embodiment of the invention.
Figure 78:
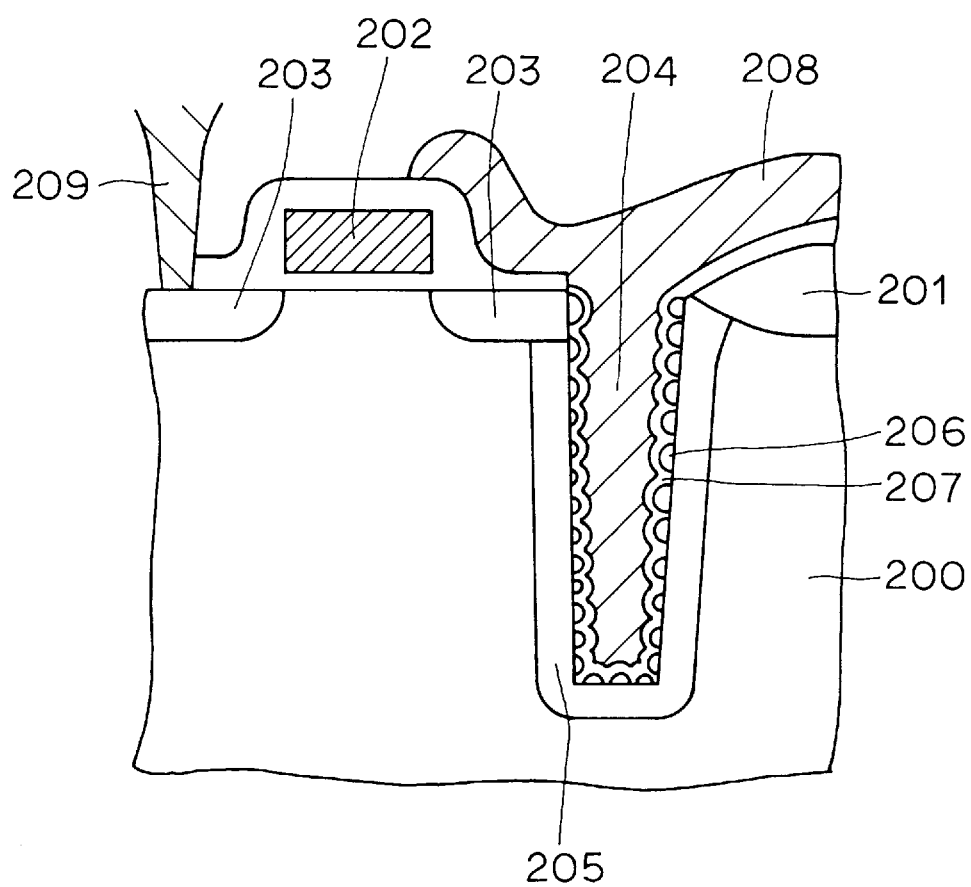
FIG. 78 is a cross section of a semiconductor memory device of the seventh embodiment of the invention.

FIG. 77 is a fragmentary cross section of a semiconductor memory device of an embodiment 6. In this embodiment, the concept of the invention shown in FIG. 75 is applied to the conventional stacked type capacitor. Also in this embodiment, a sufficiently large capacitor capacity can be ensured with a small occupied area.

Embodiment 7

At the surface of a semiconductor substrate 200, an isolating oxide film 201 is formed. On semiconductor substrate 200, a gate electrode 202 is provided. In semiconductor substrate 200 on both sides of gate electrode 202, source/drain layers 203, 203 are provided. In semiconductor substrate 200, a trench 204 for forming a capacitor is provided. An impurity diffused layer 205 which will be a storage node is provided surrounding trench 204. One of source/drain layers 203 is connected to impurity diffused layer 205. On the inner wall surface of trench 204, silicon particles 206 are formed. A capacitor insulating film 207 covers the inner wall surface of the trench 204, so as to cover silicon particles 206. A cell plate 208 is filled in trench 204.

Bit line 209 is connected to the other one of source/drain layers 203. In the semiconductor memory device of Embodiment 7, since surface area of the storage node is enlarged by means of silicon particles 206, capacitor capacitance can be increased by the increase of the surface area.

The silicon particles 206 are formed in the following manner. Namely, an amorphus thin film is formed on the inner wall surface of trench 204. Thereafter, by effecting thermal treatment, silicon particles 206 are formed on the inner wall surface of the trench 204.

According to the semiconductor memory device of the first aspect of the invention, as described hereinbefore, the cylindrical storage node is provided at its inner wall with the protruded conductors, so that the capacitor capacity is increased owing to the large surface area of the protruded conductors. Short-circuit does not occur between the cylindrical storage node and an adjacent cylindrical storage node.

According to the semiconductor memory device of the second aspect of the invention, the storage node is provided at its outer surface with concave portions hollowed inwardly from the outer surface, so that the outer surface of the storage node has a large area, resulting in a large capacitor capacity.

According to the method of manufacturing the semiconductor memory device of the third and fourth aspects of the invention, the protruded conductors are formed only at the inner wall of the cylindrical storage node, so that short-circuit does not occur between the cylindrical storage node and an adjacent cylindrical storage node adjoining to the former storage node., and the semiconductor memory device can have a large capacitor capacity.

According to the method of manufacturing the semiconductor memory device of the fifth aspect of the invention, the storage node covered with the metal film is heated to form the silicide film on the surface of the storage node. Thereafter, the silicide film is condensed, and then the condensed silicide films are removed from the surface of the storage node. Thereby, the concave portions hollowed inwardly from the surface of the storage node are formed at the surface of the storage node, so that the storage node has a large surface area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a semiconductor substrate which is provided at a main surface with a conductive layer;
   a word line and a bit line formed on said semiconductor substrate;

an insulating film provided on said semiconductor substrate and covering said word line and said bit line;

a contact hole provided in said insulating film for partially exposing said conductive layer;

a cylindrical storage node electrically connected to said conductive layer;

wherein said cylindrical storage node includes a first bottom conductive layer which is in contact with said conductive layer through said contact hole and is disposed along a surface of said insulating film, a second bottom conductive layer provided on said first bottom conductive layer, a side wall conductive portion, which is continuous with and extends upwardly from an outer periphery of said second bottom conductive layer and has an inner wall and an outer wall, and a protruded conductor, which is provided at said inner wall of said cylindrical storage node formed of said second bottom conductive layer and said side wall conductive portion and protrudes in a radially inward direction of said cylindrical storage node, said protruded conductor comprising a plurality of protrusions which are in the shape of hemispheres each connected at the base thereof to the inner wall of said cylindrical storage node, wherein said protruded conductor is not provided at said outer wall of said cylindrical storage node;

a capacitor insulating film which covers the entire outer surface of said cylindrical storage node including outer surfaces of said hemispherically shaped protrusions of said protruded conductor; and a cell plate covering said outer surface of said cylindrical storage node with said capacitor insulating film therebetween.

2. A semiconductor memory device, comprising:

a semiconductor substrate;

a storage node comprising polysilicon provided on said semiconductor substrate, said storage node being provided at an outer surface with a concave portion hollowed inwardly from said outer surface, said concave portion comprising a plurality of concave hemispherical surfaces with their bases at said outer surface of said storage node, with a metal contaminant selected from the group consisting of Ti, Ta, Hf, and Zr remaining in said storage node as a result of processing to form said concave hemispherical surfaces;

a capacitor insulating film which covers the entire outer surface of said storage node including a surface of said concave portion and the concave hemispherical surfaces thereat; and a cell plate covering said outer surface of said storage node with said capacitor insulating film therebetween.

3. The semiconductor memory device according to claim 2, wherein:

said concave portion is hemispherical in shape.

4. The semiconductor memory device according to claim 2, further comprising:

a silicide film which is disposed between said storage node and said capacitor insulating film for filling said concave portion.

5. The semiconductor memory device according to claim 2, wherein:

said storage node includes an upwardly extending cylindrical storage node.

* * * * *